(12) United States Patent
Hekmatshoartabari et al.

(10) Patent No.: US 11,132,177 B2
(45) Date of Patent: Sep. 28, 2021

(54) CMOS-COMPATIBLE HIGH-SPEED AND LOW-POWER RANDOM NUMBER GENERATOR

(71) Applicant: International Business Machines Corporation, Armonk, NY (US)

(72) Inventors: Bahman Hekmatshoartabari, White Plains, NY (US); Ghavam Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 315 days.

(21) Appl. No.: 16/412,249

(22) Filed: May 14, 2019

(65) Prior Publication Data
US 2020/0364032 A1 Nov. 19, 2020

(51) Int. Cl.
*H03M 1/12* (2006.01)
*G06F 7/58* (2006.01)

(52) U.S. Cl.
CPC .......... *G06F 7/588* (2013.01); *H03M 1/1245* (2013.01)

(58) Field of Classification Search
CPC .............................. H03M 1/1245; G06F 7/588
(Continued)

(56) References Cited

U.S. PATENT DOCUMENTS 5,392,381 A * 2/1995 Furuya ................... G01H 3/00
704/201
6,061,702 A 5/2000 Hoffman
(Continued)

FOREIGN PATENT DOCUMENTS

CN 106020770 A 10/2016

OTHER PUBLICATIONS

K. Choi et al., "The Effect of Metal Thickness, Overlayer and High-k Surface Treatment on the Effective Work Function of Metal Electrode," Proceedings of 35th European Solid-State Device Research Conference, 2005 (ESSDERC 2005), pp. 101-104 (Sep. 2005).
(Continued)

*Primary Examiner* — Peguy Jean Pierre
(74) *Attorney, Agent, or Firm* — Jeffrey S LaBaw; Michael J. Chang, LLC

(57) ABSTRACT

CMOS-compatible high-speed and low power random number generator and techniques for use thereof are provided. In one aspect, a random number generator includes: a noise amplification unit configured to generate an amplified noise signal, wherein the noise amplification unit includes noise amplification unit transistors having a threshold voltage ($V_{t,amp}$) of about 0; and a computing unit configured to process the amplified noise signal from the noise amplification unit to generate a stream of random numbers, wherein the computing unit comprises computing unit transistors having absolute values of a $V_{t,compute}$ that are larger than the $V_{t,amp}$ of the noise amplification unit transistors in the noise amplification unit. For digital implementations, an analog-to-digital converter configured to digitize the amplified noise signal can be employed. For analog implementations, a sample and hold circuit configured to sample the amplified noise signal can be employed. A method for random number generation is also provided.

25 Claims, 14 Drawing Sheets

(58) Field of Classification Search
USPC .......................................................... 341/155
See application file for complete search history.

(56) References Cited

U.S. PATENT DOCUMENTS

| | | | |
|---|---|---|---|
| 6,195,669 B1* | 2/2001 | Onodera | G06F 7/588 |
| | | | 708/250 |
| 6,324,558 B1 | 11/2001 | Wilber | |
| 6,492,843 B1 | 12/2002 | Giduturi et al. | |
| 6,661,253 B1 | 12/2003 | Lee et al. | |
| 7,979,481 B2 | 7/2011 | Sato | |
| 9,747,078 B2 | 8/2017 | Moschopoulos et al. | |
| 9,985,615 B2 | 5/2018 | Feng et al. | |
| 2006/0020647 A1 | 1/2006 | Simon et al. | |
| 2007/0180009 A1 | 8/2007 | Gutnik | |
| 2008/0126458 A1 | 5/2008 | Shin | |
| 2017/0161022 A1 | 6/2017 | Chen et al. | |
| 2018/0341462 A1 | 11/2018 | Chen et al. | |

OTHER PUBLICATIONS

Wei Chen et al., "A 1.04 µW truly random number generator for Gen2 RFID tag," Asian Solid-State Circuits Conference, Nov. 2009, pp. 117-120.
International Search Report and Written Opinion for PCT/IB2020/054426 dated Aug. 25, 2020 (11 pages).

* cited by examiner

2300

| Fabrication steps performed only on noise amplification unit: | Fabrication steps performed simultaneously on noise amplification and computing units: | Fabrication steps performed only on computing unit: |

2302 — Provide an SOI substrate

2306 — Reduce SOI thickness of noise amplification portion by selective etching.

2306 — Form mask on computing portion.

2308 — Remove mask from computing portion.

2310 — Continue transistor fabrication and chip fabrication.

FIG. 23

CMOS-COMPATIBLE HIGH-SPEED AND LOW-POWER RANDOM NUMBER GENERATOR

GENERATOR

Field of the Invention

The present invention relates to random number generation, and more particularly, to complementary metal oxide semiconductor (CMOS)-compatible high-speed and low power random number generator and use thereof for random number generation.

BACKGROUND OF THE INVENTION

Random number generation is an important element of secure systems and widely used in encryption and secure communication. For example, unique random keys may be generated and transferred between a host and a user which are in principle impossible to decode by other hosts and users if generated based on truly random numbers (rather than pseudo-random numbers which are generated from mathematical algorithms). Random numbers are also of interest for stochastic computing.

However, physical sources of random fluctuation generally pose one or more of the following limitations, (i) they require high powers to generate, e.g., shot noise of an avalanche diode, (ii) they require high powers to amplify, e.g., thermal noise of a resistor, (iii) they are not compatible with semiconductor technology, e.g., shot noise of a vacuum tube. Power consumption is an important factor in many applications where the system is already constrained by battery power for computation and signal transmission.

For instance, solid-state devices such as avalanche diodes (and to a lesser extent, Zener diode) can create significant shot noise but require high bias voltage and/or current for operation in this regime. Such devices (e.g., reversed biased base-emitter junction of bipolar transistors) have been used as a noise source for random number generation. However, the required power is too high for applications such as Internet-of-Things (IoT) which have strict constraints on power consumption.

Therefore, techniques for low power, high-speed random number generation would be desirable.

SUMMARY OF THE INVENTION

The present invention provides complementary metal oxide semiconductor (CMOS)-compatible high-speed and low power random number generator and use thereof for random number generation. In one aspect of the invention, a random number generator is provided. The random number generator includes: a noise amplification unit configured to generate an amplified noise signal, wherein the noise amplification unit includes noise amplification unit transistors having a threshold voltage ($V_{t,amp}$) of about 0; and a computing unit configured to process the amplified noise signal from the noise amplification unit to generate a stream of random numbers, wherein the computing unit comprises computing unit transistors having absolute values of a $V_{t,compute}$ that are larger than the $V_{t,amp}$ of the noise amplification unit transistors in the noise amplification unit.

In another aspect of the invention, another random number generator is provided. The random number generator includes: a noise amplification unit configured to generate an amplified noise signal, wherein the noise amplification unit includes at least one load transistor and at least one amplifying transistor having a $V_{t,amp}$ of about 0; and a computing unit having an analog-to-digital converter and a digital processor, wherein the analog-to-digital converter is configured to digitize the amplified noise signal, wherein the digital processor is configured to process the amplified noise signal that has been digitized by the analog-to-digital converter to generate a stream of random numbers, and wherein the computing unit includes computing unit transistors having positive absolute values of a $V_{t,compute}$ that are larger than the $V_{t,amp}$ of the at least one load transistor and the at least one amplifying transistor.

In yet another aspect of the invention, yet another random number generator is provided. The random number generator includes: a noise amplification unit configured to generate an amplified noise signal, wherein the noise amplification unit includes at least one load transistor and at least one amplifying transistor having a $V_{t,amp}$ of about 0; and a computing unit having a sample and hold circuit and a comparator, wherein the sample and hold circuit is configured to sample the amplified noise signal, wherein the comparator is configured to compare the amplified noise signal sampled by the sample and hold circuit to a reference voltage ($V_{ref}$) to generate a stream of random numbers, and wherein the computing unit includes computing unit transistors having positive absolute values of a $V_{t,compute}$ that are larger than the $V_{t,amp}$ of the at least one load transistor and the at least one amplifying transistor.

In still yet another aspect of the invention, a method for random number generation is provided. The method includes: generating an amplified noise signal using a noise amplification unit having noise amplification unit transistors having a $V_{t,amp}$ of about 0; and processing the amplified noise signal from the noise amplification unit using a computing unit to generate a stream of random numbers, wherein the computing unit has computing unit transistors having positive absolute values of a $V_{t,compute}$ that are larger than the $V_{t,amp}$ of the noise amplification unit transistors.

A more complete understanding of the present invention, as well as further features and advantages of the present invention, will be obtained by reference to the following detailed description and drawings.

BRIEF DESCRIPTION OF THE DRAWINGS

FIG. 23 is a diagram illustrating an exemplary methodology for co-fabricating the noise amplification unit monolithically with the computing unit by selective SOI substrate thickness modification using an etch to selectively reduce the SOI substrate thickness according to an embodiment of the present invention.

DETAILED DESCRIPTION OF PREFERRED EMBODIMENTS

As provided above, solid-state devices such as avalanche diodes and Zener diodes can be used as a noise source for random number generation. However, these devices require high bias voltage and/or current for operation, and thus are unsuited for ultra-low power applications such as IoT.

On the other hand, if a weak noise source is used, then a high-gain amplifier is needed for amplification. High gain amplifiers require cascading (therefore higher current due to multiple stages), cascoding (therefore higher voltage to ensure transistors remain in saturation), or both. As such, high gain amplifiers require powers that are also too high for ultra-low power applications such as IoT.

Advantageously, provided herein is a CMOS-compatible high-speed, low power random number generator and techniques for use thereof in random number generation. The present random number generator is a hybrid system that includes a computing unit and a high-speed, low-power noise amplification unit. Preferably, the noise amplification unit has an operation frequency above 100 megahertz (MHz) and a power consumption below 10 microwatts (μW). For instance, in one exemplary embodiment, the noise amplification unit has an operation frequency of about 500 MHz and a power consumption of about 1 μW. As will be described in detail below, the computing unit includes standard normally-off (enhancement-mode) transistors configured as standard digital, analog and mixed signal circuits. Normally-off transistors have threshold voltages with absolute positive values (i.e., positive threshold voltage values for n-channel transistors, and negative threshold voltage values for p-channel transistors). The high-speed low-power noise amplification unit includes transistors having threshold voltages ($V_t$) of about zero and configured as amplifier circuits for the amplification of the noise generated by transistors and the resistive bias network. For clarity, the threshold voltage of the computing unit transistors will also be referred to herein as $V_{t,compute}$, and the threshold voltage of the noise amplification unit transistors will also be referred to herein as $V_{t,amp}$.

Each amplifier circuit includes at least one amplifying transistor and one load transistor. As will be described in detail below, in one exemplary embodiment, the amplifying transistors and the load transistors are biased at zero gate-to-source voltage and operate in a subthreshold regime. The amplified noise generated by the amplifier circuit is then processed by the computing unit to generate a stream of random numbers.

Figure 1:
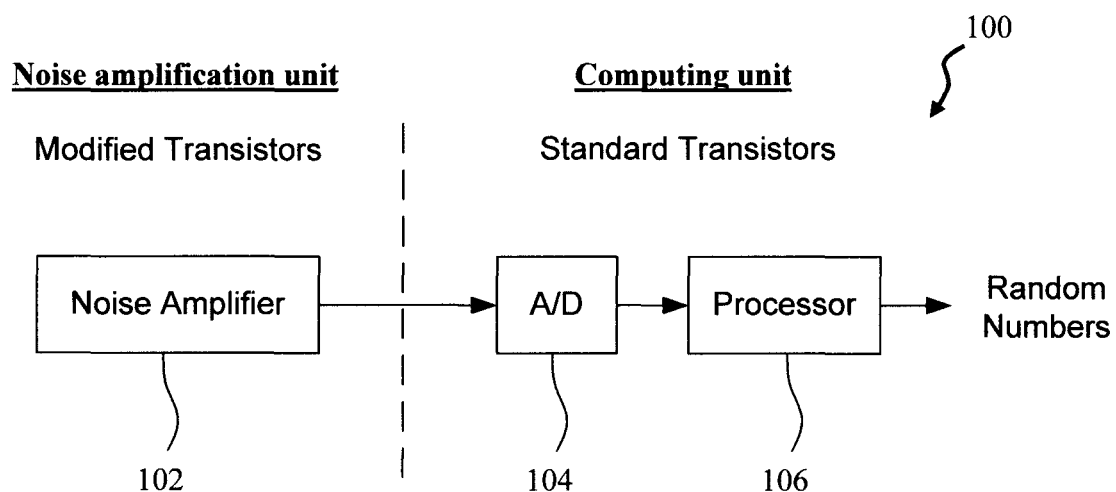
FIG. 1 is a diagram illustrating an exemplary digital implementation of the present random number generator according to an embodiment of the present invention.
Figure 2:
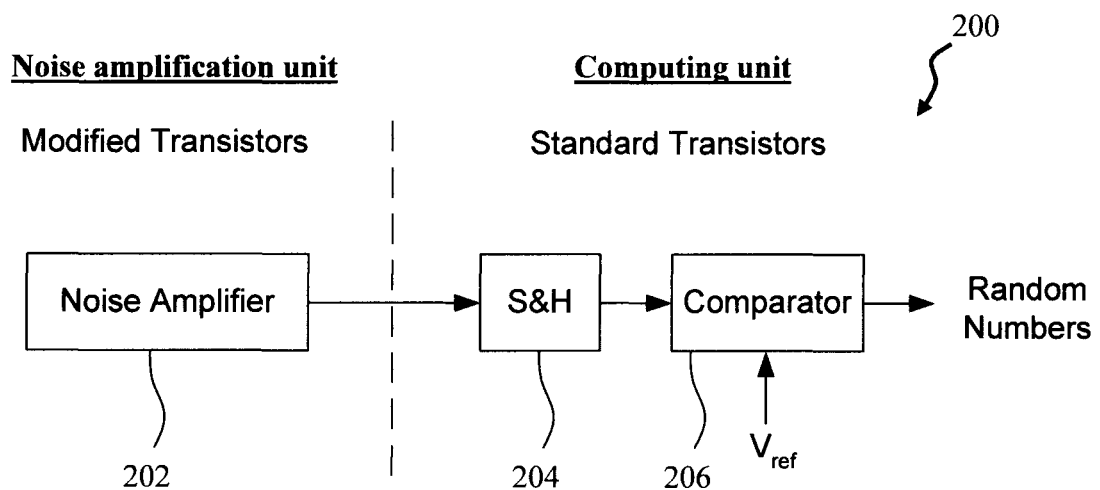
FIG. 2 is a diagram illustrating an exemplary analog implementation of the present random number generator according to an embodiment of the present invention.

An overview of the present random number generator is provided in FIG. 1 and FIG. 2. For instance, according to one exemplary embodiment, a digital implementation of the random number generator is shown as system 100 in FIG. 1. As shown in FIG. 1, noise amplified by noise amplifier 102 (within the noise amplification unit) is digitized using an analog-to-digital converter (A/D) 104. A digital processor 106 (within the computing unit) is then used to process the digitized noise signal to generate random numbers. For instance, by way of example only, when the amplified noise signal has a positive value that can register a logic '1' and when it has a negative value that can register a logic '0', or vice versa. See also FIG. 18, described below. In some embodiments, the digital processor 106 is an application-specific processor dedicated to the task of generating random numbers. In other embodiments, the digital processor 106 is a general-purpose processor such as a central processing unit (CPU) that performs various computing tasks in addition to generating random numbers. The noise amplification unit can include other components such as batteries, voltage regulators and/or noise shields as are commonly used in conjunction with analog amplifier circuits. The computing unit can include or operate in conjunction with various other components of a larger computing system (see, e.g., FIG. 19 described below).

According to another exemplary embodiment, an analog implementation of the present random number generator is shown as system 200 in FIG. 2. As shown in FIG. 2, the noise signal amplified by noise amplifier 202 (i.e., the noise amplification unit) is sampled using a sample and hold (S&H) circuit 204. A comparator 206 (within the computing unit) compares the amplified noise signal to a reference voltage ($V_{ref}$) to generate random numbers. For instance, by way of example only, when the amplified noise signal is greater than or equal to $V_{ref}$ then that can register a logic '1' and when the amplified noise signal is less than $V_{ref}$ that can register a logic '0', or vice versa. For instance, by way of example only, when the drain-to-drain supply voltage of Vdd=1V and source-to-source supply voltage of VSS=0V is used to bias the noise amplifier 202, $V_{ref}$ may be chosen to be $V_{ref}$=Vdd/2=0.5V (see, e.g., FIG. 18 described below). The reference voltage, $V_{ref}$, can be calibrated by averaging, i.e., probing the DC level of the noise amplifier output, e.g., using a low-pass filter (see below). In some embodiments, the S&H circuit 204 and the comparator circuit 206 are part of an analog or mixed signal processor fabricated as an integrated circuit and employed in a larger computing system (see, e.g., FIG. 19 described below).

Figure 3:
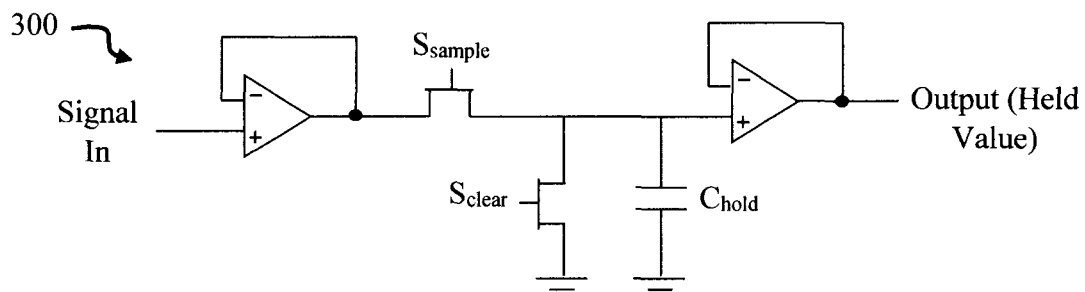
FIG. 3 is a diagram illustrating an exemplary sample and hold circuit according to an embodiment of the present invention.

An exemplary sample and hold (S&H) circuit 300 that may be employed in accordance with the present techniques is shown in FIG. 3. Sample and hold circuit 300 is an analog device that samples the continuously varying noise signal (Signal In) and holds its value at a constant level (Output (Held Value)).

Figure 4:
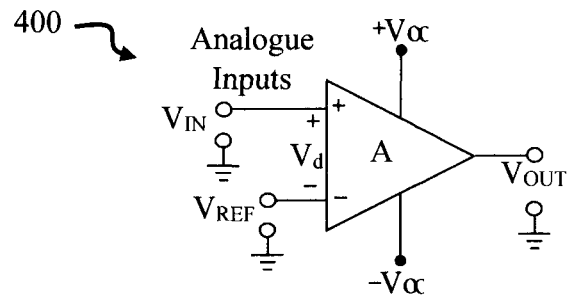
FIG. 4 is a diagram illustrating an exemplary comparator according to an embodiment of the present invention.

An exemplary comparator 400 that may be employed in accordance with the present techniques is shown in FIG. 4. If $V_{IN} > V_{REF}$ then $V_{OUT} = +V_C$ and if $V_{IN} < V_{REF}$ then $V_{OUT} = -V_C$. To further reduce the power consumption, the power supply to the noise amplifier 202, the comparator 400 and the S&H circuit 300 may be cut off until the desired start time for key generation.

Figure 5:
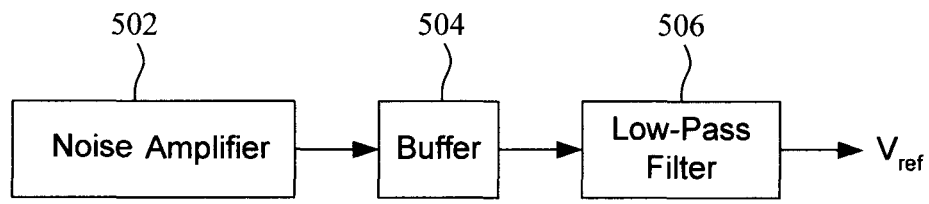
FIG. 5 is a diagram illustrating an exemplary system for calibrating a reference voltage (Vref) according to an embodiment of the present invention.

As provided above, $V_{ref}$ can be calibrated by averaging the output of the noise amplifier 502. See, for example, FIG. 5. As shown in FIG. 5, according to an exemplary embodiment, the DC level output of the noise amplifier 502 is averaged using a low-pass filter 506 to generate $V_{ref}$. A voltage buffer 504 can be employed to prevent the signal from being affected by the current drawn by the load.

Figure 6:
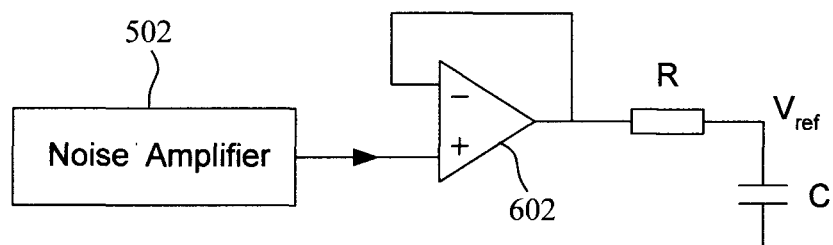
FIG. 6 is a diagram illustrating an exemplary system for generating $V_{ref}$ according to an embodiment of the present invention.

The averaging of the output from the noise amplifier 502 can be performed continuously to generate $V_{ref}$. See FIG. 6. As shown in FIG. 6, the output of the noise amplifier 502 is fed to a voltage buffer 602 which includes an operational amplifier (OP-AMP) with a unity feedback loop. A resistor R and a capacitor C are present on the output from the voltage buffer 602 thus forming a passive (RC) low-pass filter. Alternatively, the output from the noise amplifier 502 can be averaged over a desired time period before the start of a random sequence, e.g., key generation. In some embodiments, the passive RC low-pass filter may be replaced with an active low-pass filter. If such an active low-pass filter has a high input impedance, the voltage buffer can be omitted.

Transistors: as highlighted above, the computing unit includes standard, normally-off (enhancement-mode) transistors configured as standard digital, analog and mixed signal circuits. By 'normally-off' it is meant that the transistors in the computing unit have positive absolute values of threshold voltage (i.e., positive for n-channel transistors and negative for p-channel transistors).

On the other hand, as highlighted above the noise amplification unit includes transistors having threshold voltages (Vt) of about zero, i.e., $V_{t,amp}$. By way of example only, a $V_t$, amp of about zero can be 0±0.3 volts (V), i.e., $V_{t,amp}$ is from about −0.3V to about 0.3V and ranges therebetween. In general, each transistor includes a source and a drain interconnected by a channel. A gate regulates the flow of electrons through the channel.

For field effect transistor (FET) devices, $V_t \approx V_{FB} + 2\phi_F + Q_B/C_{ox}$, where $V_{FB}$ is the flat-band voltage, $\phi_F$ is Fermi potential of the semiconductor channel material with respect to the intrinsic Fermi level, $Q_B$ is the depletion region charge in the channel under the gate and $C_{ox}$ is the dielectric capacitance per unit area of the gate. Further, $V_{FB} = \phi_{MS} - Q_{ox}/C_{ox}$, $\phi_F = -V_{th} \ln(N_D/n_i)$ for n-type channel doping, and $\phi_F = V_{th} \ln(N_A/n_i)$ for p-type channel doping, $\phi_{MS}$ is the workfunction difference between the gate electrode and the channel semiconductor material, $Q_{ox}$ is an equivalent charge associated with the gate dielectric (including fixed charge and interface charge), $V_{th}$ is the thermal voltage (about 26 mV at room temperature), $N_D$ is the concentration of n-type doping (acceptors) in the semiconductor channel material, $N_A$ is the concentration of p-type doping (donors) in the semiconductor channel, $n_i$ is the intrinsic carrier concentration in the semiconductor channel material, and $\phi_{MS} = \phi_M - \phi_S$ where $\phi_M$ is the workfunction of the gate electrode and $\phi_S$ is the workfunction of the semiconductor channel material given by $\phi_S = \chi + E_g/2q + \phi_F$, where $\chi$ is the electron affinity of the semiconductor channel material, $E_g$ is the bandgap of the semiconductor channel material and q is the electron charge. For bulk substrate transistors, and partially-depleted silicon-on-insulator (SOI) transistors where the depletion region width $W_D$ is smaller than the thickness of the SOI layer $t_{channel}$ (i.e., $W_D < t_{channel}$), $Q_B = -qN_D W_D$ for n-type channel doping and $Q_B = qN_A W_D$ for p-type channel doping where $W_D = [-2\varepsilon_S \cdot 2\phi_F / qN_D]^{1/2}$ for n-type channel doping and $W_D = [2\varepsilon_S \cdot 2\phi_F / qN_A]^{1/2}$ for p-type channel doping, where $\varepsilon_S$ is the dielectric constant of the semiconductor channel material. For fully-depleted channel transistors, $Q_B = -qN_D t_{channel}$ for n-type channel doping and $Q_B = qN_A t_{channel}$ for p-type channel doping.

Therefore, $V_t$ can be adjusted by tuning the parameters described above during the fabrication process, particularly substrate doping $N_A$ or $N_D$, gate dielectric capacitance $C_{ox}$, gate electrode workfunction $\phi_M$, SOI thickness $t_{channel}$ (applicable to fully-depleted SOI), and combinations thereof. In addition, $V_t$ may be altered after the fabrication process by applying a bias voltage $V_B$ to the body of bulk transistors or the carrier substrate of SOI transistors. For bulk transistors, the resulting $V_t$ shift is approximately $[2\varepsilon_S qN_A (-V_B)]^{1/2}/C_{ox}$ for p-type channel doping, and $-[2\varepsilon_S qN_D (V_B)]^{1/2}/C_{ox}$ (assuming no or small channel doping, thin SOI, the $V_t$ shift is approximately $-V_B C_{box}/C_{ox}$ (assuming no or small channel doping, thin SOI, and/or back-side channel inversion), where $C_{box}$ is the dielectric capacitance of the buried insulator. While the above equations are provided as a guide, it should be noted that they are approximate with finite ranges of validity, and may be combined with higher-order device models, numerical simulation and/or experimentation as necessary, for fine tuning, as is generally known in the art.

Figure 7:
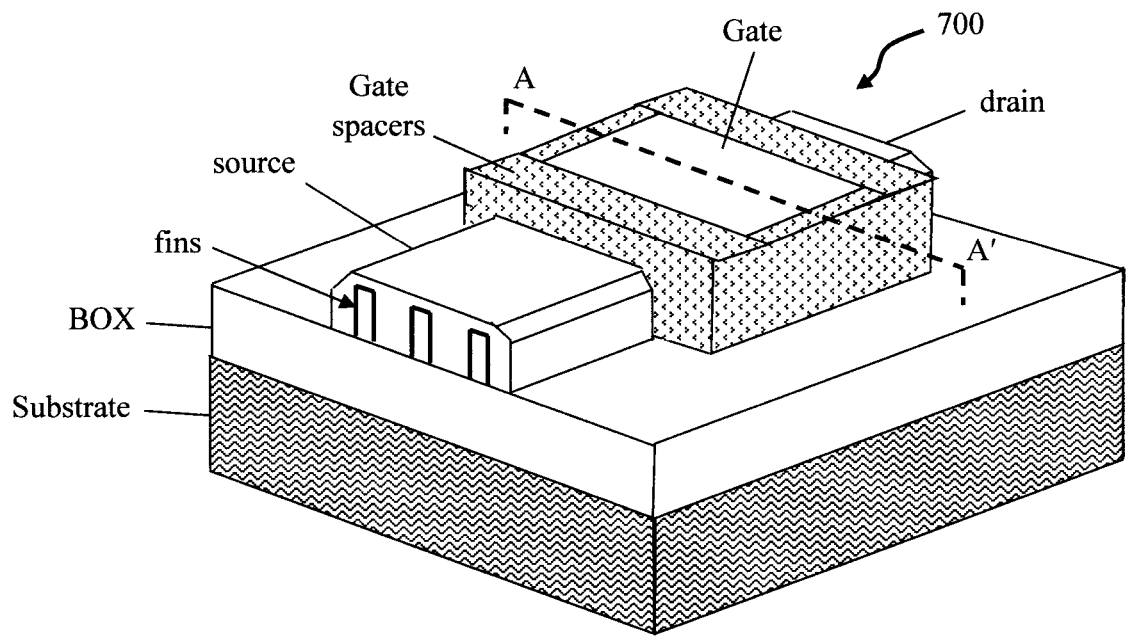
FIG. 7 is a diagram illustrating an exemplary fin field effect transistor according to an embodiment of the present invention.

An exemplary finFET 700 is shown in FIG. 7. As described in detail below, the present techniques can be implemented using planar and non-planar transistor structures (e.g., finFET) in conjunction with bulk or silicon-oninsulator (SOI) wafer technology. Thus, the depiction of a finFET device in FIG. 7 is merely for illustrative purposes and is not intended to limit the present teachings to one particular type of transistor structure.

As shown in FIG. 7, a source and a drain are interconnected by at least one (in this case "fin-shaped") channel. A gate electrode is present over the fins. The gate electrode is offset from the source and drain by gate spacers. In this example, the finFET 700 is formed on a SOI wafer. Generally, an SOI wafer includes a SOI layer separated from an underlying substrate by a buried insulator. When the buried insulator is an oxide, it is also referred to herein as a buried oxide or BOX. The fins are patterned in the SOI layer.

As explained above, the transistors utilized in the computing unit are fabricated using parameters with standard values resulting in absolute positive $V_t$ values of $V_{t,compute}$. Adjusting the $V_t$ of the transistors for the noise amplification unit to have values of $V_{t,amp}$ about zero can be accomplished in a number of ways. For instance, in one exemplary embodiment, the transistors are high-κ/metal gate electrode transistors such as finFETs (bulk or silicon-on-insulator (SOI)), fully-depleted SOI (FDSOI) transistors, and/or partially-depleted SOI (PDSOI) transistors where a high-κ gate dielectric separates the metal gate electrode from the channel. The term "high-κ" refers to a material having a relative dielectric constant κ which is much higher than that of silicon dioxide (e.g., a dielectric constant κ=25 for hafnium oxide ($HfO_2$) rather than 4 for $SiO_2$). In that case, a metal gate electrode with a lower/higher workfunction (compared to that used for the transistors in the computing unit) can be used for the n-channel/p-channel high-κ/metal gate transistors, respectively, in order to achieve a $V_{t,amp}$ of about zero. See, for example, FIG. 8.

Figure 8:
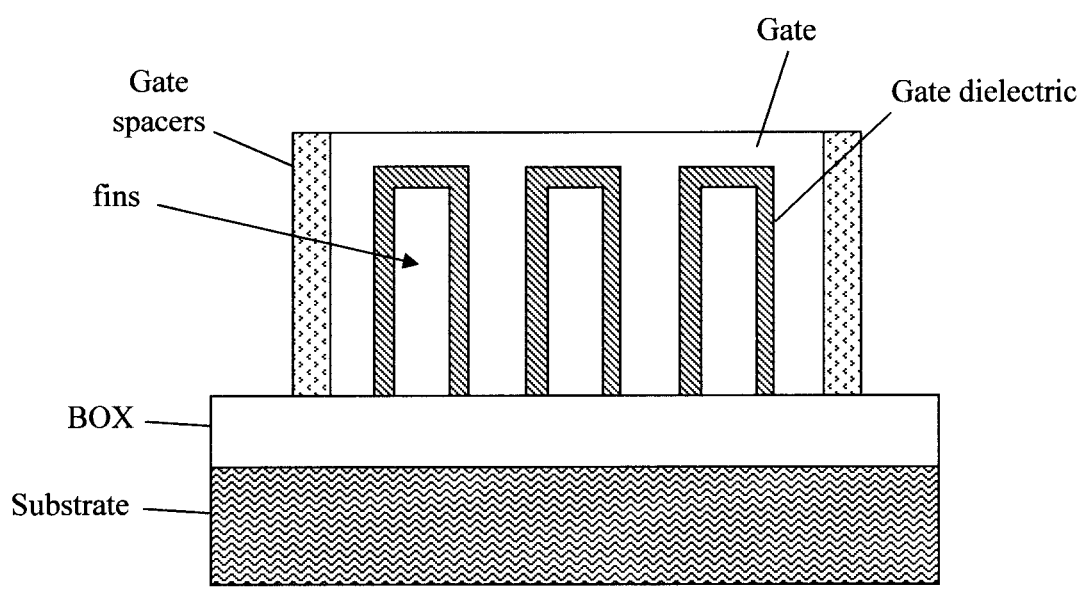
FIG. 8 is a diagram illustrating a cross-sectional view of the finFET of FIG. 7 according to an embodiment of the present invention.

FIG. 8 is a cross-sectional cut along line A-A' of finFET 700 (see FIG. 7). Again, the depiction of a finFET architecture is a non-limiting example provided merely to illustrate the present techniques. As shown in FIG. 8, a gate dielectric separates the fins/channels from the gate electrode. According to an exemplary embodiment, the gate electrode is a metal gate and the gate dielectric is a high-κ gate dielectric. In that case, a gate electrode metal with a workfunction lower/higher compared to that used for the computing unit can be used for the n-channel/p-channel high-κ/metal gate transistors, respectively, in order to achieve a $V_{t,amp}$ of about zero. For example, and by way of example only, if the desired $V_t$ reduction for the n-channel transistors in the noise amplification unit compared to the n-channel transistors used in the computing unit is 0.3V, then a gate electrode metal having a workfunction 0.3 electronvolts (eV) lower than that used for the n-channel transistors in the computing unit can be used for the n-channel transistors in the noise amplification unit.

Suitable n-type work-function setting gate electrode metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type work-function setting gate electrode metals include, but are not limited to, TiN, TaN, and tungsten (W). TiN and TaN are relatively thick (e.g., greater than about 2 nm) when used as p-type work-function setting metals. However, very thin TiN or TaN layers (e.g., less than about 2 nm) may also be used beneath Al-containing alloys in n-type work-function stacks to improve electrical properties such as gate leakage currents. Thus, there is some overlap in the exemplary n- and p-type work-function setting metals given above. Suitable high-κ gate dielectrics include, but are not limited to, $HfO_2$ and/or lanthanum oxide ($La_2O_3$).

By way of example only, the work-function for a high-κ/metal gate transistor can be increased/decreased based on the particular type/amount of work-function setting gate electrode metal or combinations of metals employed. For instance, applying a TaN cap about 10 nm thick onto a TiN gate about 3.6 nm thick increases the effective work-function (EWF) of the gate from about 4.3 electron volts (eV) to about 4.8 eV, whereas a TiN cap of the same thickness on the TiN gate increases the EFW to only about 4.6 eV. See, for example, K. Choi et al., "The Effect of Metal Thickness, Overlayer and High-κ Surface Treatment on the Effective Work Function of Metal Electrode," Proceedings of $35^{th}$ European Solid-State Device Research Conference, 2005 (ESSDERC 2005), pp. 101-104 (September 2005), the contents of which are incorporated by reference as if fully set forth herein.

Alternatively, according to another exemplary embodiment, the transistors used in the noise amplifier are partially depleted (PD) and are adjusted to have threshold voltages, $V_{t,amp}$, of about zero by using a lower doping concentration of the channel compared to that used for the transistors in the computing unit. Suitable n-type dopants include, but are not limited to, phosphorous (P) and/or arsenic (As). Suitable p-type dopants include, but are not limited to, boron (B). These transistors can be implemented in planar bulk or PDSOI wafer technology. See, e.g., FIG. 9.

Figure 9:
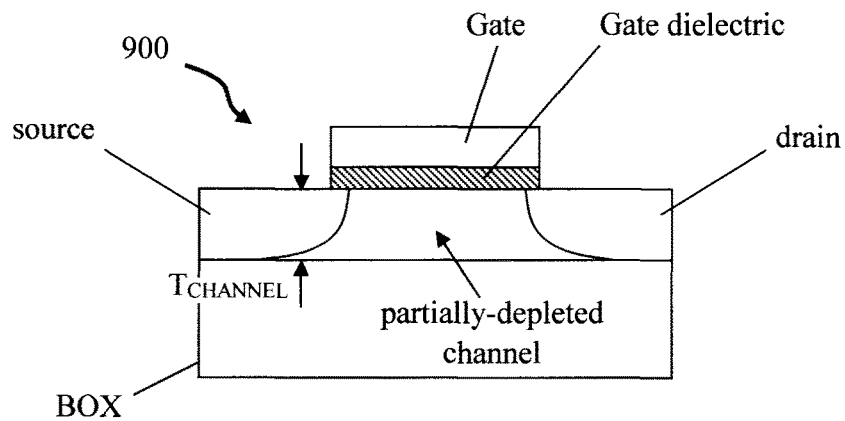
FIG. 9 is a cross-sectional diagram illustrating an exemplary planar FET according to an embodiment of the present invention.

FIG. 9 is a cross-sectional diagram of a planar FET 900 that may be employed in accordance with the present techniques. Again, the depiction of this particular FET architecture is a non-limiting example provided merely to illustrate the present techniques. As shown in FIG. 9, the channel that interconnects the source and drain is partially-depleted. The doping concentration of the partially-depleted channel can be decreased compared to that used in the computing unit to achieve a $V_{t,amp}$ of about zero (versus $V_{t,compute}$ for the computing unit). As explained above, the desired $V_t$ reduction, $\Delta V_t$, e.g., for n-channel transistors is given by $\Delta V_t = V_{t,amp} - V_{t,compute} = \phi_{F,amp} - \phi_{F,compute} + (Q_{B,amp} - Q_{B,compute})/C_{ox} = V_{th} \ln(N_{A,amp}/N_{A,compute}) + 2(\varepsilon_S q V_{th})^{1/2} \{[N_{A,amp} \ln(N_{A,amp}/n_i)]^{1/2} - [N_{A,compute} \ln(N_{A,compute}/n_i)]^{1/2}\}/C_{ox}$, where the subscripts "compute" and "amp" refer to the values in the computing unit and the noise amplification unit, respectively. The required $N_{A,amp}$ for the desired $\Delta V_t$ can be determined by solving the above equation numerically.

According to yet another exemplary embodiment, the transistors used in the noise amplifier are PDSOI transistors and are modified to have threshold voltages, $V_{t,amp}$, of about zero by reducing the channel thickness $T_{CHANNEL}$ (see FIG. 9). PDSOI transistors often have a channel thickness of from about 50 nanometers (nm) to about 100 nm. Thus, according to an exemplary embodiment, the $T_{CHANNEL}$ of the PDSOI transistor is from about 20 nm to about 50 nm and ranges therebetween. As explained above, the desired $\Delta V_t$, e.g., for n-channel transistors is given by $\Delta V_t = V_{t,amp} - V_{t,compute} = (Q_{B,amp} - Q_{B,compute})/C_{ox} = (qN_A t_{channel,amp} - qN_A t_{channel,compute})/C_{ox} = qN_A \Delta t_{channel}/C_{ox}$, where the subscripts "amp" and "compute" refer to the values in the computing unit and the noise amplification unit, respectively. Therefore, the channel thickness can be reduced by $\Delta t_{channel} = \Delta V_t C_{ox}/qN_A$ to result in the desired $\Delta V_t$.

In still yet another exemplary embodiment, the $V_t$ of the transistors used in the noise amplification unit are adjusted to be about zero by using opposite channel doping compared to that used for enhancement-mode transistors having the same channel type in the computing unit, thus creating depletion-mode transistors in the noise amplification unit. Note, channel type (n-channel or p-channel) refers to the type of carriers (electrons or holes, respectively) responsible for conduction in the channel, whereas channel doping (n-type or p-type) refers to the type of dopants (donors or acceptors, respectively) in the channel. For example, an enhancement-mode transistor with p-type channel doping is an n-channel transistor whereas a depletion-mode transistor with p-type channel doping is a p-channel transistor.

In one non-limiting example, a dopant of opposite polarity (n- or p-type dopant) is used for the channel of an enhancement-mode transistor as opposed to the dopant used for its source and drain in the computing unit, whereas a dopant of same polarity (n- or p-type dopant) is used for the channel of a depletion-mode transistor as the dopant used for its source and drain in the noise amplification unit. For instance, in this example, when the source and drain of an enhancement-mode transistor are doped with an n-type dopant, its channel is doped with a p-type dopant, and vice versa, whereas when the source and drain of a depletion-mode transistor are doped with an n-type dopant, its channel is also doped with a n-type dopant, and vice versa. The channel doping concentration of the depletion-mode transistors in the noise amplification unit is chosen to result in a threshold voltage of about zero, i.e., $V_{t,amp} \approx \phi_M - \chi - E_g/2q + [2\varepsilon_S q N_A V_{th} \ln(N_A/n_i)]^{1/2}/C_{ox} \approx 0$ for p-type channel doping, and $V_{t,amp} \approx \phi_M - \chi - E_g/2q - [2\varepsilon_S q N_D V_{th} \ln(N_D/n_i)]^{1/2}/C_{ox} \approx 0$, for n-type channel doping.

The transistors used for noise amplification and computing units are fabricated using standard complementary metal-oxide semiconductor (CMOS)-compatible techniques. According to an exemplary embodiment, the noise amplification unit is fabricated monolithically with the computing unit, e.g., on the same integrated circuit chip. See for example FIGS. 20-23, described below, depicting exemplary monolithic fabrication process flows.

Alternatively, the transistors adjusted to have $V_t \approx 0V$ for the noise amplifier can be fabricated on a separate chip and bonded to a standard chip (that includes the computing unit) using known bonding techniques such as flip-chip bonding. In some embodiments, this approach is advantageous in that it allows major alterations in the fabrication process flow of the transistors used in the noise amplifying unit (for example simultaneous change of various device parameters) without affecting the fabrication process flow of the standard transistors used for the computing unit.

Figure 10:
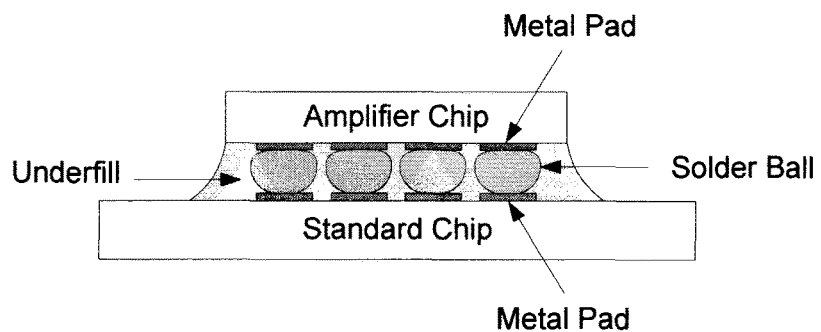
FIG. 10 is a cross-sectional diagram illustrating solder bump bonding having been used to bond a chip containing the computing unit to a chip containing the noise amplification unit according to an embodiment of the present invention.

Embodiments are also contemplated herein where the computing unit and the noise amplification unit are both fabricated on standard chips using standard parameters resulting in absolute positive $V_t$ for all transistors. The chips are then bonded together. A bias voltage is then applied to the substrate (in the case of bulk transistors) or the carrier substrate (in the case of SOI transistors) of the noise amplification chip thus altering the $V_t$ to about zero. See, for example, FIG. 10. As shown in FIG. 10, solder bump bonding is used to bond a chip containing at least one transistor for the noise amplification unit (labeled "Amplifier chip") to a chip containing at least one standard transistor for the computing unit (labeled "Standard chip") via solder balls between metal pads on the bonding surfaces of the respective chips. An underfill material encapsulates the bond. The threshold voltages of the transistors in the Amplifier chip are then shifted to be about zero by applying a positive (or negative) bias to the carrier substrate of the n-channel (or p-channel) transistors. The carrier substrate of the standard chip can be connected to, e.g., ground, as the global ground of the system. Thus, in this exemplary embodiment, standard transistors are fabricated for both the noise amplifier and the computing unit, and modification of the transistors for the noise amplifier occurs by selectively applying a substrate voltage bias to the noise amplifier transistors.

Figure 11:
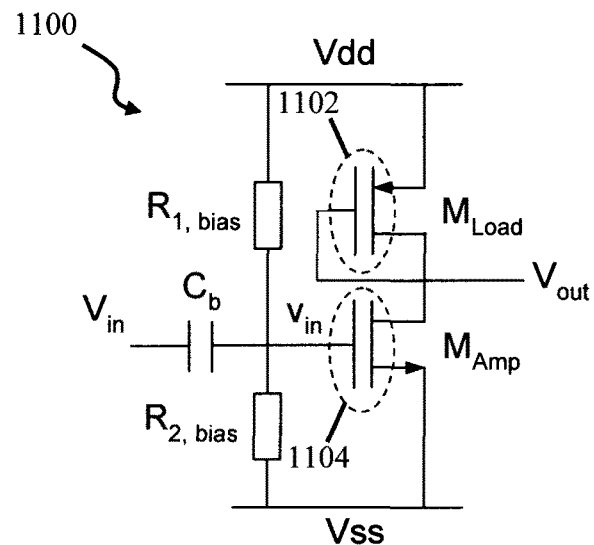
FIG. 11 is a cross-sectional diagram illustrating an exemplary noise amplifier circuit according to an embodiment of the present invention.

Noise amplifier: an amplifier circuit 1100 is shown schematically in FIG. 11 having a load transistor 1102 ("$M_{LOAD}$") and an amplifying transistor 1104 ("$M_{AMP}$") with interconnected source and drains, respectively, producing an output voltage ($V_{out}$). In conventional amplifier circuit 1100, load transistor 1102 and amplifying transistor 1104 are standard transistors. A capacitor ($C_b$) is employed to block the direct (DC) portion of the input voltage ($V_{in}$). As known in the art, blocking the DC portion of a signal with a high-pass filter (such as that formed with $C_b$) inevitably blocks a near-DC low-frequency portion of the signal as well. The larger the $C_b$, the lower the maximum frequency effectively blocked. Bias resistors ($R_{1,bias}$ and $R_{2,bias}$) are present between $V_{in}$ and the drain-drain voltage (Vdd) and the source-source voltage (Vss) sources, respectively.

With this amplifier circuit 1100, amplifier voltage gain $A_V$ is:

$$A_V \approx -g_{m,Amp}\left(r_{ds,Amp} \| \frac{1}{g_{m,load}}\right) \approx -\frac{g_{m,Amp}}{g_{m,Load}} \approx -\frac{(W/L)_{Amp}}{(W/L)_{Load}},$$

wherein $g_{m,load}$ is the transconductance of the load transistor 1102, $g_{m,Amp}$ is the transconductance of the amplifying transistor 1104, $r_{ds,Amp}$ is the drain-source resistance of the amplifying transistor 1104, and "$\|$" denotes parallel connection (for two given resistors $R_1$ and $R_2$, the resistance resulting from the parallel connection of the two resistors is given by $R_1\|R_2 = (1/R_1 + 1/R_2)^{-1}$). This is because the drain terminal of $M_{LOAD}$ is connected to its gate terminal and therefore the effective output resistance of $M_{LOAD}$ is equal to $1/g_{m,Load}$. Thus, a large voltage gain ($A_V = V_{in}/V_{out}$) requires large transistor width/length (W/L) for $M_{AMP}$ and therefore a large bias current which results in a high standby power consumption. In addition, since L is typically fixed in a fabricated integrated circuit, a large W/L means a large W and therefore a large gate capacitance which reduces the bandwidth. A large gate capacitance also results in a large dynamic (switching) power consumption. Moreover, the input bias network consumes standby power (to provide a positive DC gate voltage bias for $M_{AMP}$), which further adds to the power consumption. $M_{AMP}$ requires a positive DC gate voltage bias because it has a positive $V_t$.

Figure 12:
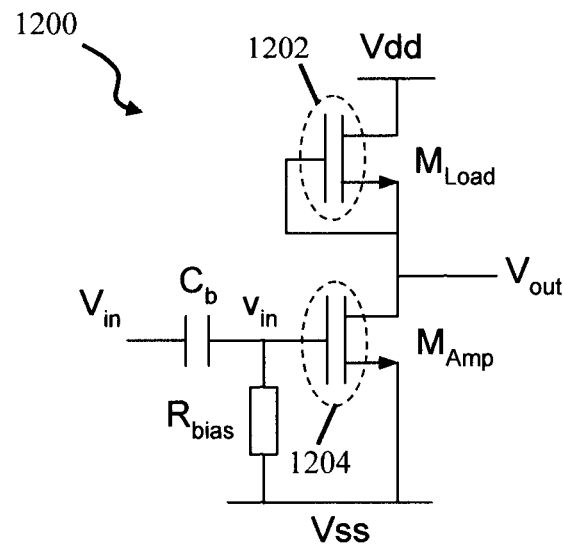
FIG. 12 is a cross-sectional diagram illustrating an exemplary noise amplifier circuit having at least one modified load transistor and at least one modified amplifying transistor according to an embodiment of the present invention.

By comparison, a noise amplifier circuit 1200 in accordance with the present techniques is depicted schematically in FIG. 12. As shown in FIG. 12, noise amplifier circuit 1200 includes at least one load transistor ("$M_{LOAD}$") 1202 and at least one amplifying transistor ("$M_{AMP}$") 1204 with interconnected source and drains, respectively, which together produce an output voltage ($V_{out}$). Load transistor 1202 and amplifying transistor 1204 have a $V_t$ of about zero volts. By way of example only, according to an exemplary embodiment, load transistor 1202 and amplifying transistor 1204 are each modified to have a $V_t$ of from about −0.3V to about 0.3V and ranges therebetween. Techniques for facilitating the transistors such as load transistor 1202 and amplifying transistor 1204 to have a Vt of about zero were provided above.

As shown in FIG. 12, a capacitor ($C_b$) is employed to block the DC portion of the input voltage ($V_{in}$). A bias resistor ($R_{bias}$) is present between $V_{in}$ and the Vss. $C_b$ and $R_{bias}$ (or $M_{bias}$) create a high-pass filter. As explained above, a high-pass filter (such as the one formed with $C_b$ and $R_{bias}$) inevitably blocks a near-DC low-frequency portion of the signal in addition to DC. The larger the $C_b$ and the larger the $R_{bias}$ (more concretely, the larger the $R_{bias}C_b$ product known as the RC delay), the lower the maximum frequency effectively blocked by the high-pass filter (i.e., the narrower the stop-band of the high-pass filter). As will be described in detail below, embodiments are also contemplated herein where $R_{bias}$ is replaced with a bias transistor $M_{bias}$.

Advantageously, with amplifier stage 1200, amplifier voltage gain $A_V$ is:

$$A_V \approx -g_{m,Amp}(r_{ds,Amp} \| r_{ds,Load}), \qquad (1)$$

wherein $g_m$ is the input to the transistor 1204 ($g_{m,Amp}$), and $r_{ds,load}$, $r_{ds,Amp}$ are the drain-source resistance of load transistor 1202 and amplifying transistor 1204, respectively. This is because the gate terminal of the load transistor 1202 is connected to its source terminal, and therefore the effective output resistance of $M_{LOAD}$ is equal to $r_{ds,Load}$. Since $r_{ds} \gg 1/g_m$, a large $A_V$ can be achieved without requiring large W/L and large bias current (see above), so far as $r_{ds,AMP}$ and $r_{ds,Load}$ are large. Additionally, the input bias network does not consume standby power because $M_{AMP}$ can be biased at zero gate-to-source voltage (since $V_t \approx 0V$).

Figure 13:
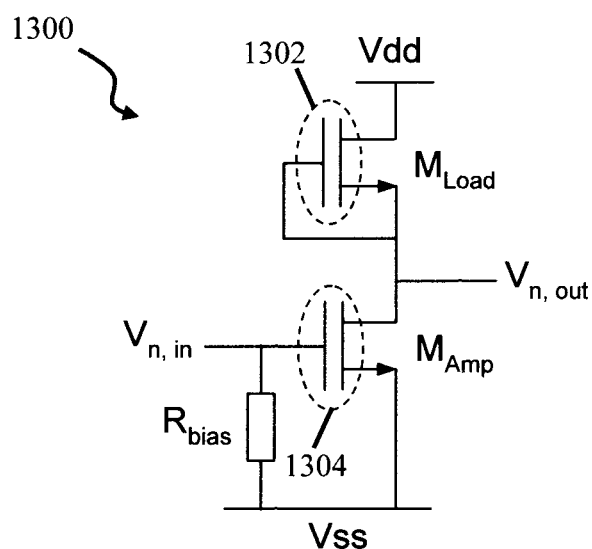
FIG. 13 is a cross-sectional diagram illustrating an N-th stage noise amplifier circuit of a multi-stage noise amplifier design according to an embodiment of the present invention.

As will be described in detail below, the present noise amplifiers can be employed in a multi-stage (i.e., N-stage) design. FIG. 13 is a schematic diagram illustrating a single stage noise amplifier circuit 1300 of that multi-stage noise amplifier design. Similar to noise amplifier circuit 1200 described in accordance with the description of FIG. 12, above, noise amplifier circuit 1300 includes at least one load transistor ("$M_{LOAD}$") 1302 and at least one amplifying transistor ("$M_{AMP}$") 1304 with interconnected source and drains, respectively. When receiving an equivalent input noise voltage ($V_{n,in}$) at its input, the noise amplifier circuit 1300 produces an equivalent output noise voltage ($V_{n,out}$) at its output, where the ratio of $V_{n,out}/V_{n,in}$ at a given frequency is equal to the voltage gain of the amplifier circuit 1300 at that frequency. Load transistor 1302 and amplifying transistor 1304 have a $V_t$ of about zero. By way of example only, according to an exemplary embodiment, load transistor 1302 and amplifying transistor 1304 have a $V_t$ of from about −0.3V to about 0.3V and ranges therebetween. Techniques for providing the transistors such as load transistor 1302 and amplifying transistor 1304 to have a $V_t$ of about zero were provided above. A bias resistor ($r_{bias}$) is present between Vin and the Vss providing a DC voltage bias of zero volts across the gate-source of $M_{AMP}$. As will be described in detail below, embodiments are also contemplated herein where $r_{bias}$ is replaced with a bias transistor $M_{bias}$.

For the single stage noise amplifier circuit 1300 of the present multi-stage noise amplifier design:

$$\overline{V_{n,out}^2} = (\overline{I_{n,Amp}^2} + \overline{I_{n,Load}^2})r_{out}^2 + \overline{V_{n,Bias}^2}A_V^2 + \overline{V_{n,in}^2}A_V^2 \qquad (2)$$

$$\overline{I_{n,Amp}^2} = \underbrace{\overline{I_{n,th,Amp}^2}}_{\text{Thermal Noise}} + \underbrace{\overline{I_{n,1/f,Amp}^2}}_{\text{Flicker Noise}} = 4kT(2/3)g_{m,Amp} + \frac{Kg_{m,Amp}^2}{C_{ox}(WL)_{Amp}f} \qquad (3)$$

$$\overline{I_{n,Load}^2} = \underbrace{\overline{I_{n,th,Load}^2}}_{\text{Thermal Noise}} + \underbrace{\overline{I_{n,1/f,Load}^2}}_{\text{Flicker Noise}} = 4kT(2/3)g_{m,Load} + \frac{Kg_{m,Load}^2}{C_{ox}(WL)_{Load}f} \qquad (4)$$

$$\overline{V_{n,Bias}^2} = 4kTR_{bias}, \; r_{out} = r_{ds,Amp} \| r_{ds,Load}, \; A_V \approx -g_{m,Amp}r_{out} \qquad (5)$$

Further, in some exemplary embodiments contemplated herein, $R_{bias}$ is replaced with a bias transistor $M_{bias}$:

$$\overline{V_{n,Bias}^2} = \left[\underbrace{\overline{I_{n,th,Bias}^2}}_{\text{Thermal Noise}} + \underbrace{\overline{I_{n,1/f,Bias}^2}}_{\text{Flicker Noise}}\right]r_{ds,bias}^2 = \qquad (6)$$

$$\left(4kT(2/3)g_{m,Bias} + \frac{Kg_{m,Bias}^2}{C_{ox}(WL)_{Bias}f}\right)r_{ds,bias}^2.$$

See, e.g., the example provided in FIG. 15 below of an N-stage noise amplifier design employing bias transistors. In the above expressions, $r_{out}$ is the output resistance of the amplifier circuit 1300 ($r_{out} \approx r_{ds,Load} \| r_{ds,Amp}$), k is the Boltzmann constant, T is the absolute temperature, K is the flicker noise constant of the transistors $M_{Load}$ and $M_{Amp}$, $f$ is the frequency and $A_V$ is the voltage gain of the amplifier circuit 1300. The $\overline{V_n^2}$ and $\overline{I_n^2}$ notations represent the spectral density (i.e., spectrum) of noise voltage and noise current, respectively. For example, $\overline{I_{n,Load}^2}$ is the noise current spectral density of $M_{Load}$, and $\overline{V_{n,Bias}^2}$ is noise voltage spectral density of $R_{Bias}$ or $M_{Bias}$.

In Equations (2)-(6) above, noise voltages and currents are given per unit bandwidth of the circuit (by definition, as customary). The $C_b$ and $R_{bias}$, (or $M_{bias}$) create a high-pass filter with a transfer function having an approximate form $|H(f)|^2 \approx f^2/[1+(f/f_L)^2]$ in one or more embodiments, where $f_L \approx 1/(2\pi R_{bias}C_b)$ for $R_{bias}$ or $f_L \approx 1/(2\pi r_{ds,bias}C_b)$ for $M_{bias}$, and the capacitance $C_{load}$ loading the output node (e.g., input capacitance of the A/D) or the intrinsic cut-off of the transistors, whichever is lower, creates a low-pass filter with a transfer function having an approximate form $|H(f)|^2 \approx 1/[1+(f/f_H)^2]$ in one or more embodiments, wherein $f_H \approx 1/(2\pi r_{out}C_{load})$ or $f_H \approx (g_m/2\pi C_{gs})_{Amp}$, respectively, where $C_{gs}$ is the gate-to-source capacitance of $M_{Amp}$. As such, according to an exemplary embodiment, the total noise voltage output (i.e., integrated over all frequencies) from the single-stage noise amplifier is determined as:

$$\overline{V_{n,out,total}^2} \approx \int_0^\infty \frac{(f/f_L)^2}{[1+(f/f_L)^2][1+(f/f_H)^2]}\overline{V_{n,out}^2}df. \qquad (7)$$

According to an exemplary embodiment, $f_H \geq 100$ MHz, for instance, $f_H \geq 500$ MHz, and $f_L$ is chosen to be equal to, or greater than the corner frequency ($f_C$) of $M_{Amp}$, $M_{Load}$, and $M_{bias}$ (i.e., $f_L \geq f_C$). Corner frequency refers to the frequency above which flicker noise becomes smaller than thermal noise (given the $1/f$ dependence of flicker noise). That is $f_C = 3Kg_m/8kTC_{ox}WL$. Therefore, in such embodiments the frequency-dependent (non-white) portion of noise (i.e., the second terms on the right hand side of Equations (3), (4) and (6)) is effectively eliminated, resulting in a substantially frequency-invariant (white) $V_{n,out}$ at frequencies from ~1.4 $f_L$ to ~1.4 $f_H$. According to an exemplary embodiment, $f_C$ is in the range of from about 100 Hz to about 100 KHz and ranges therebetween, for example from about 1 KHz to about 10 KHz and ranges therebetween. It is notable that the above Equations (1)-(7) are first-order expressions providing an approximate description of the circuit 1300 and as such are useful as a guide for describing or designing a noise amplification circuit in accordance with the present techniques, and are not intended to be definitive or restrictive.

Figure 14:
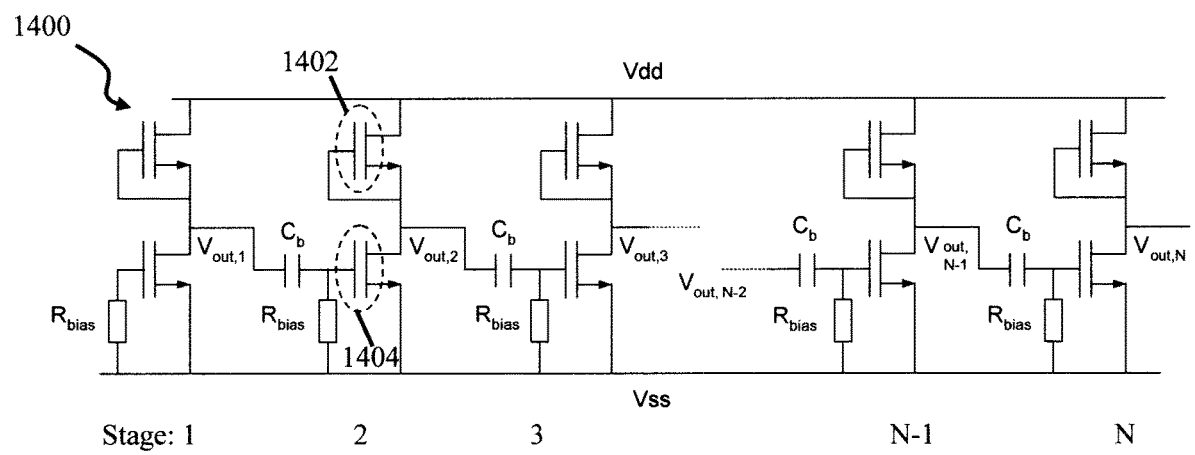
FIG. 14 is a cross-sectional diagram illustrating an exemplary N-stage noise amplifier circuit according to an embodiment of the present invention.

FIG. 14 is a schematic diagram illustrating an exemplary N-stage noise amplifier circuit 1400 in accordance with the present techniques. As shown in FIG. 14, noise amplifier circuit 1400 includes multiple stages, i.e., Stages 1, 2, 3, . . . , N−1, and N. Each stage is configured, for example, as described in accordance with the description of FIG. 12 and FIG. 13, above. For instance, each stage includes at least one load transistor 1402 and at least one amplifying transistor 1404 with interconnected source and drains, respectively, which together produce an output voltage (Vout,1 for Stage 1, Vout,2 for stage 2, etc.). As described in detail above, load transistor 1402 and amplifying transistor 1404 have a Vt of about zero. By way of example only, according to an exemplary embodiment, load transistor 1402 and amplifying transistor 1404 have a Vt of from about −0.3V to about 0.3V and ranges therebetween. Techniques for providing transistors such as load transistor 1402 and amplifying transistor 1404 with a $V_t$ of about zero were provided above.

As shown in FIG. 14, a capacitor ($C_b$) is employed between stages to block the DC portion of the input voltage received from the preceding stage. The $C_b$ along with a bias resistor ($R_{bias}$) creates a high-pass filter. In some embodiments, an additional DC-blocking capacitor (e.g., $C_b$) may be placed between $V_{out,N}$ and the element receiving $V_{out,N}$ in the computing unit (e.g. the A/D converter) to block the DC portion of $V_{out,N}$. As explained above, $C_b$ blocks a low-frequency near-DC portion of the signal passing through it.

As highlighted above, $R_{bias}$ can be replaced with a bias transistor $M_{bias}$. In that case, the $C_b$ and $M_{bias}$ create a high-pass filter. See, for example, FIG. 15. FIG. 15 is a schematic diagram illustrating an exemplary N-stage noise amplifier circuit 1500 in accordance with the present techniques. Noise amplifier circuit 1500 is configured the same as noise amplifier circuit 1400 (FIG. 14) except that bias resistor ($R_{bias}$) (of noise amplifier circuit 1400) is replaced with a bias transistor ($M_{bias}$) 1506. In this exemplary embodiment, the gate and source terminals of Minas are connected to each other thus creating an equivalent bias resistance equal to $r_{ds,bias}$, the drain-source resistance of $M_{bias}$.

Figure 15:
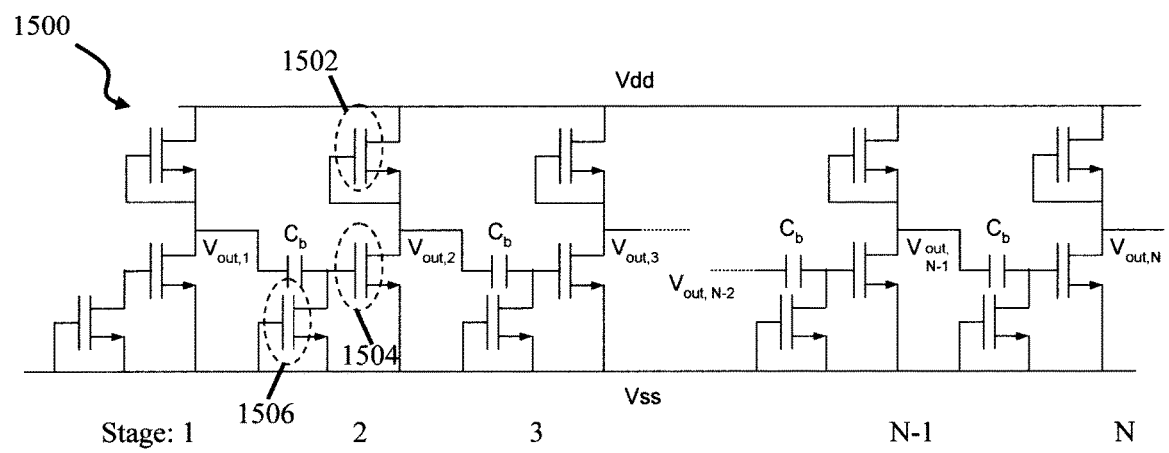
FIG. 15 is a cross-sectional diagram illustrating an exemplary N-stage noise amplifier circuit having a bias transistor ($M_{bias}$) according to an embodiment of the present invention.

Namely, as shown in FIG. 15, noise amplifier circuit 1500 includes multiple stages, i.e., Stages 1, 2, 3, . . . , N−1, and N. Each stage is configured, for example, as described in accordance with the description of FIG. 12 and FIG. 13, above. For instance, each stage includes at least one load transistor 1502 and at least one amplifying transistor 1504 with interconnected source and drains, respectively, which together produce an output voltage (Vout,1 for Stage 1, Vout,2 for stage 2, etc.). As described in detail above, load transistor 1502 and amplifying transistor 1504 are each modified to have a Vt of about zero. By way of example only, according to an exemplary embodiment, load transistor 1502 and amplifying transistor 1504 have a $V_t$ of from about −0.3V to about 0.3V and ranges therebetween. Techniques for providing the transistors such as load transistor 1502 and amplifying transistor 1504 with a $V_t$ of about zero were provided above.

As shown in FIG. 15, a capacitor ($C_b$) is employed between stages to block DC from the input voltage received from the preceding stage. Here the $C_b$ along with bias transistor ($M_{bias}$) 1506 creates a high-pass filter with an RC delay of approximately $r_{ds,bias} C_b$. Similar to the amplifier circuit 1400 of FIG. 14, a DC blocking capacitor (e.g., $C_b$) may also be placed between $V_{out,N}$ and the receiving element in the computing unit.

Figure 16:
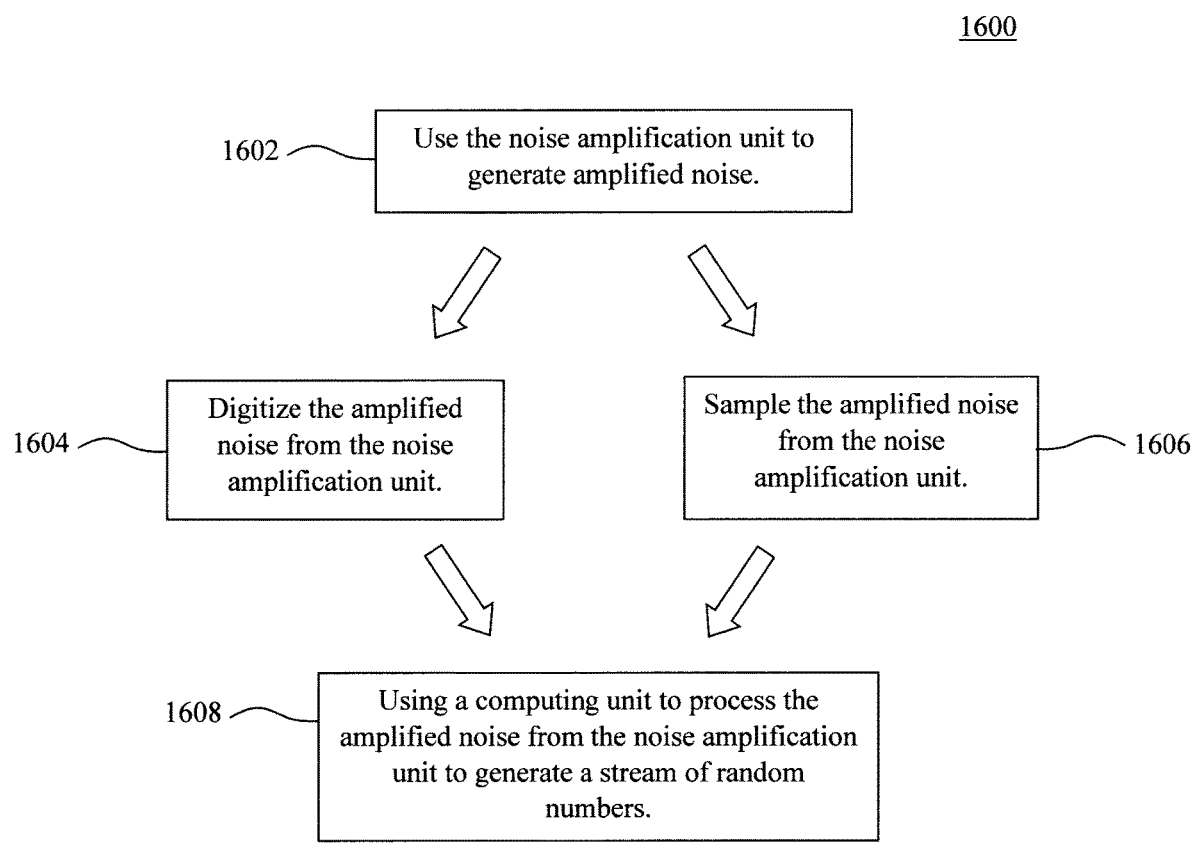
FIG. 16 is a diagram illustrating an exemplary methodology for random number generation using the present random number generator according to an embodiment of the present invention.

FIG. 16 is a diagram illustrating an exemplary methodology 1600 for random number generation using the present random number generator, such as system 100 of FIG. 1 (at least in part a digital implementation) or system 200 of FIG. 2 (at least in part an analog implementation). As provided above, the present random number generator is a hybrid system that has a computing unit and a noise amplification unit. By "hybrid" it is meant that different types of transistors are combined to form the random number generator, i.e., standard transistors are used in the computing unit whereas transistors with near-zero $V_t$ are used in the noise amplification unit. Specifically, the computing unit includes standard, normally-off transistors with absolute positive $V_t$ configured as standard digital, analog and mixed signal circuits. On the other hand, the noise amplification unit includes transistors with $V_t$ of about zero and configured as amplifier circuits for the amplification of the noise generated by transistors and the resistive bias network.

Specifically, as described for example in conjunction with the description of FIG. 12 and FIG. 13, above, the noise amplification unit can have at least one load transistor and at least one amplifying transistor, each of which have a $V_t$ of from about −0.3V to about 0.3V and ranges therebetween. In some exemplary embodiments, as described above, the load transistor and the amplifying transistor is biased at zero gate-to-source voltage to operate in a subthreshold regime. In some exemplary embodiments, as described above, the $V_t$ of the transistors in the noise amplifier is shifted to about zero by applying a positive (negative) bias to the substrate of the n-channel (p-channel) transistors (e.g., a bulk substrate for bulk transistors and a carrier substrate for SOI transistors). As further described above, the $V_t$ of the load transistor and the amplifying transistor can also be adjusted to about zero by using a lower (higher) gate-electrode work-function for n-channel (p-channel) transistors, by using a lower doping concentration of the transistor channel, by using the opposite doping type of the transistor channel and/or by using a thinner transistor channel, relative to a standard, normally-off transistors such as those used in the computing unit. Thus, when modified, the transistors of the noise amplification unit have a $V_t$ of about zero, as opposed to a positive absolute value of $V_t$ as with standard transistors.

In step 1602, the noise amplification unit is used to amplify the noise generated by the transistors and the resistive bias network (based on an applied voltage Vdd/Vss), as explained above with respect to the single-stage amplifier circuit 1300 of FIG. 13, and its usage in the multi-stage amplifier circuits 1400 and 1500 in FIGS. 14 and 15, respectively. For instance, with respect to FIGS. 14 and 15, the spectral density of the input-referred thermal noise-voltage of $M_{Amp}$ in Stage 1 is given by $4kT(2/3g_{m,Amp})$. Assuming that all amplifier stages have the same voltage gain $A_V$, the contribution of the thermal noise of $M_{Amp}$ to the spectral density of the noise voltage output of the amplifier (within the amplifier bandwidth) is given by $4kT(2/3g_{m,Amp}).(A_V)^{2N}$. The total spectral density of the noise voltage at the amplifier output ($\overline{V_{n,out,N}^2}$) is the sum of the spectral densities of the amplified noise contributed by each of the transistors and resistors in the circuit.

According to one exemplary embodiment, a digital implementation of the random number generator is employed, whereby the amplified noise from the noise amplification unit is digitized, e.g., using an A/D converter. See step 1604. Alternatively, according to another exemplary embodiment, an analog implementation of the random number generator is employed, whereby the amplified noise from the noise amplification unit is sampled, e.g., using a S&H circuit. See step 1606.

In step 1608, the amplified noise from the noise amplification unit is processed by the computing unit to generate a stream of random numbers. With a digital implementation (see step 1604—described above), the digitized, amplified noise signal from the A/D converter is processed by the computing unit to generate the stream of random numbers. For instance, as provided above, when the amplified noise signal is greater than or equal to $V_{ref}$ the digital processing unit within the computing unit can register a logic '1' and when the amplified noise signal is less than $V_{ref}$ the digital processing unit within the computing unit can register a logic '0' or vice versa. For instance, for $V_{ref}=0$, when the amplified noise signal has a zero or positive value that can register a logic '1' and when it has a negative value that can register a logic '0' or vice versa. Alternatively, with an analog implementation (see step 1606—described above), the sampled amplified noise signal from the S&H circuit can be compared, by the computing unit, to a reference voltage ($V_{ref}$) to generate the stream of random numbers. For instance, as provided above, when the amplified noise signal is greater than or equal to Vref that can register a logic '1' and when the amplified noise signal is less than Vref that can register a logic '0' or vice versa.

Figure 17:
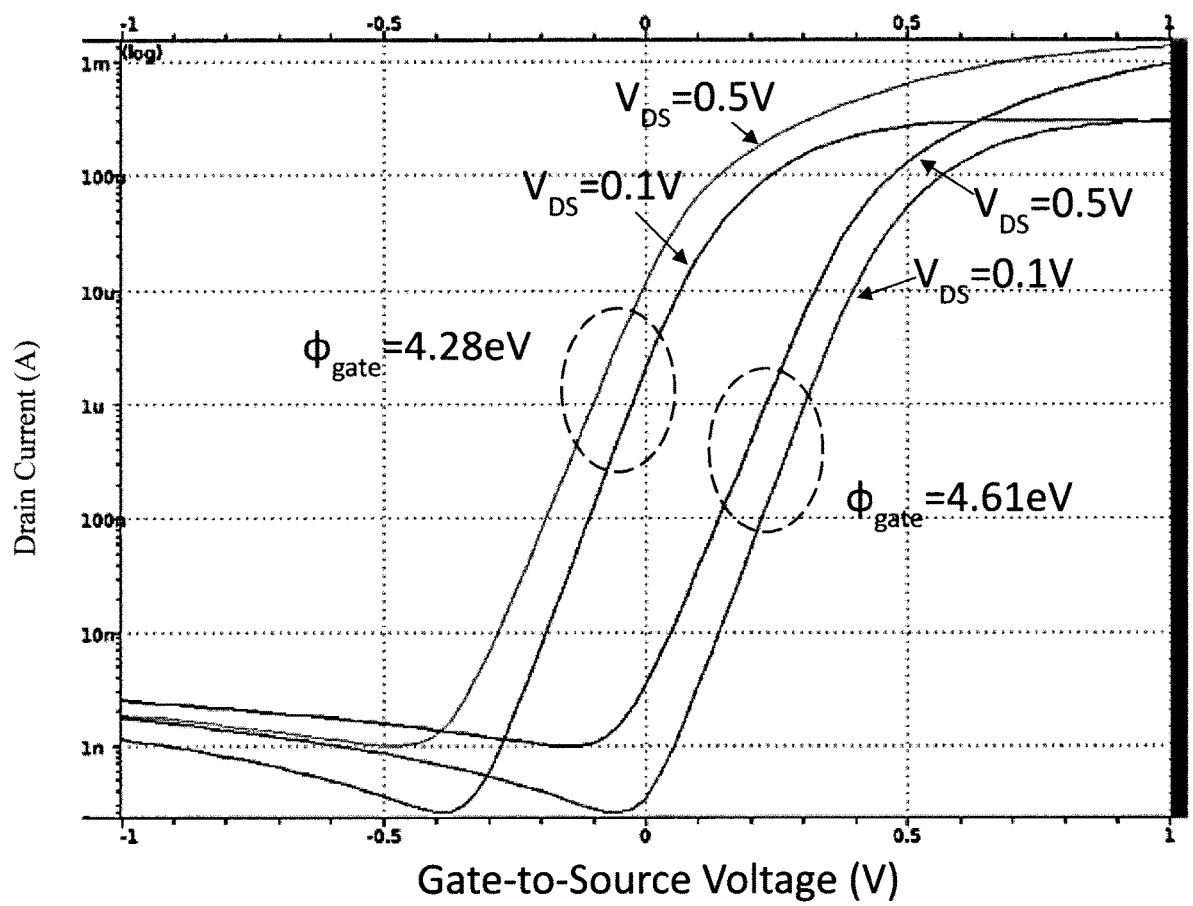
FIG. 17 is a plot illustrating how the transistors of the noise amplification unit can be biased at zero gate-to-source voltage and operate in a subthreshold regime according to an embodiment of the present invention.

FIG. 17 is a plot 1700 illustrating how the transistors of the noise amplification unit can be biased at zero gate-to-source voltage and operate in a subthreshold regime. In this example, high-κ/metal gate bulk FinFET transistors were employed for the amplification and load transistors in the amplification unit, each FinFET transistor having a gate-length L=30 nm, fin pitch $F_{pitch}$=80 nm, and body (fin) thickness, $t_{FIN}$=15 nm. As shown in plot 1700, standard transistors with the work-function of the metal gate ($\Phi_{gate}$) of 4.61 eV have a positive threshold voltage (about 0.5V). However, using a metal gate with $\Phi_{gate}$ of 4.28 eV reduces the threshold voltage to about zero volts (about 0.2V) and the transistors operate in subthreshold at gate-to-source voltage ($V_{GS}$) of zero volts (since $V_{GS}$=0V is about 0.2V below $V_t \approx 0.2$V). In some embodiments, the standard transistors (with $\Phi_{gate}$=4.61 eV) and the near-zero $V_t$ transistors (with $\Phi_{gate}$=4.28 eV) are co-integrated using a monolithic fabrication process, as explained above.

Figure 18:
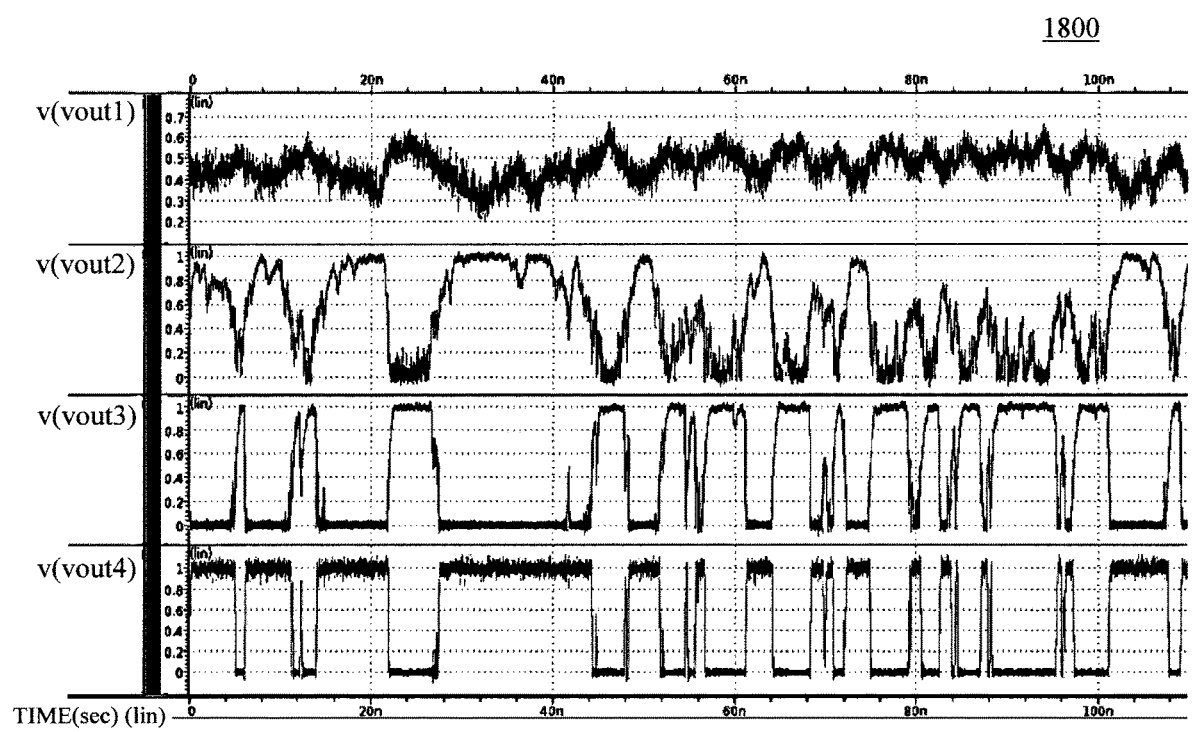
FIG. 18 is an example simulation plot illustrating the simulated outputs of the various stages of an exemplary high-speed and low-power noise amplification unit according to an embodiment of the present invention.

FIG. 18 is an exemplary simulation plot 1800 illustrating the high-speed and low-power characteristics of a noise amplification unit, in this example implemented as a 4-stage amplifier with Vdd=1V, $V_{SS}$=0, $R_{bias}$=100 MΩ, $C_b$=1 pF, using the FinFET devices (with $\Phi_{gate}$=4.28 eV) described in accordance with the description of FIG. 17, above. In this example, $V_{ref}$ can be chosen to be equal to Vdd/2=0.5V. Therefore, when the amplified noise signal has a value greater than or equal to 0.5V the computing unit can register a logic '1' and when it has a value less than 0.5V the computing can register a logic '0' or vice versa. Using that convention, sampling $V_{out,4}$ for example at 20 ns, 40 ns, 60 ns, 80 ns, 100 ns can generate a random sequence 11010. Alternatively, in some exemplary embodiments a DC-blocking capacitor (e.g., $C_b$) is placed between the output stage and the computing unit, and $V_{ref}$ is chosen to be zero volts. In this example, each stage consumes a DC (standby) power of approximately 1V×10 μA=10 μW (total of 40 μW for the 4 stages).

While the transistors used in the exemplary embodiments of FIGS. 12-15 are n-channel transistors, it is to be understood that p-channel transistors may be used as well (after necessary adjustments to account for opposite bias polarities for p-channel transistors). Preferably, all of the transistors used in the noise amplification unit are either n-channel or p-channel. Namely, while the noise amplification unit can be implemented by a combination of n-channel and p-channel transistors (including embodiments where $M_{Amp}$ and $M_{Load}$ in a single stage have opposite channel types), adjusting $V_t$ to be about zero for both p-channel and n-channel transistors requires a greater effort (e.g., a larger number of fabrication process steps in monolithic co-integration) than adjusting $V_t$ to be about zero for only one channel type. In addition, implementing the noise amplification unit with a single channel type (either n-channel or p-channel) facilitates the shifting of $V_t$ to about zero by applying a single bias voltage to the substrate (e.g., to the carrier substrate of SOI transistors) as explained earlier.

Figure 19:
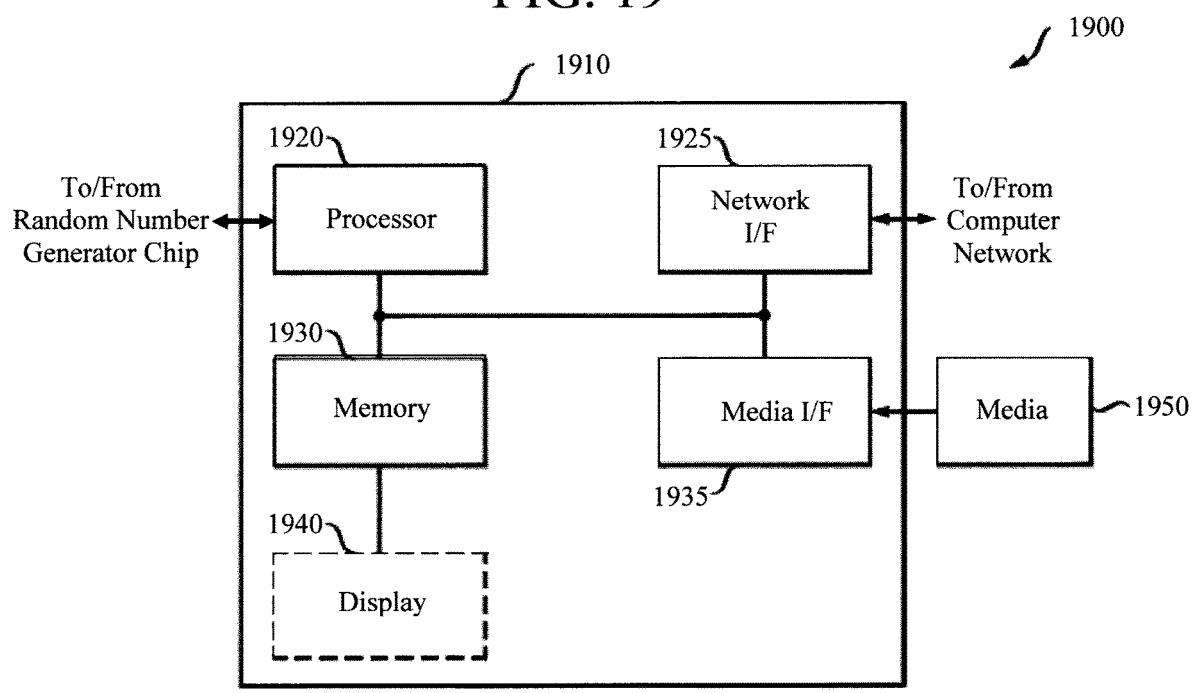
FIG. 19 is a diagram illustrating an exemplary apparatus for implementing the techniques presented herein according to an embodiment of the present invention.

By way of example only, the present random number generator can be implemented in a computer-based apparatus such as apparatus 1900 of FIG. 19. As shown in FIG. 19, apparatus 1900 includes a computer system 1910 and removable media 1950. Computer system 1910 includes a processor device 1920, a network interface 1925, a memory 1930, a media interface 1935 and an optional display 1940. Network interface 1925 allows computer system 1910 to connect to a network, while media interface 1935 allows computer system 1910 to interact with media, such as a hard drive or removable media 1950. In the exemplary embodiment of FIG. 19, the random number generator is fabricated on a separate chip and is in communication with the processor through input/output (I/O) lines, which may represent, by way of example only, connections between an amplifier chip bonded to a standard chip as shown in FIG. 10, or the more advanced through-silicon-via (TSV) connections known in the art. In other embodiments, the random number generator is co-integrated (fabricated monolithically) with at least a portion of the processor device and is therefore part of block 1920.

Processor device 1920 can be configured to implement the methods, steps, and functions disclosed herein. The memory 1930 could be distributed or local and the processor device 1920 could be distributed or singular. The memory 1930 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1920. With this definition, information on a network, accessible through network interface 1925, is still within memory 1930 because the processor device 1920 can retrieve the information from the network. It should be noted that each distributed processor that makes up processor device 1920 generally contains its own addressable memory space. It should also be noted that some or all of computer system 1910 can be incorporated into an application-specific or general-use integrated circuit.

Optional display 1940 is any type of display suitable for interacting with a human user of apparatus 1900. Generally, display 1940 is a computer monitor or other similar display.

As provided above, in one exemplary embodiment, the noise amplification unit is fabricated monolithically with the computing unit, e.g., on the same integrated circuit chip. As will now be described, this monolithic fabrication process can be carried out in a number of different ways. In each case, standard CMOS-compatible process flows are employed with slight modifications to enable certain steps to be performed selectively on the noise amplification portion versus the computing portion and vice versa. Thus, the following descriptions will focus on these modifications to the standard process flows, and reference will be made to the fabrication steps that are performed on only the transistors of the noise amplification unit and those that are performed only on the transistors of the computing unit with respect to the standard co-fabrication steps that are performed on both the noise amplification unit and computing unit transistors simultaneously. As used herein, a "standard" CMOS-compatible process refers to any known established fabrication process used for monolithic fabrication of integrated circuits. As known by a person of ordinary skill in the art, the details of such fabrication processes may vary between different technology nodes (for example, between 45 nm and 14 nm technology nodes), or as adopted or practiced by different research and development facilities. As highlighted above, each transistor generally includes a source and a drain that are interconnected by a channel, and a gate (separated from the channel by a gate dielectric) that regulates the flow of electrons through the channel. The transistors are fabricated on a substrate which can be a bulk semiconductor substrate, or an SOI substrate having a SOI layer over a buried insulator (e.g., a BOX). Source/drain and channel doping, including doping type (e.g., n-type or p-type) can be performed using standard ion-implantation techniques with the appropriate dopant at the desired concentration.

Figure 20:
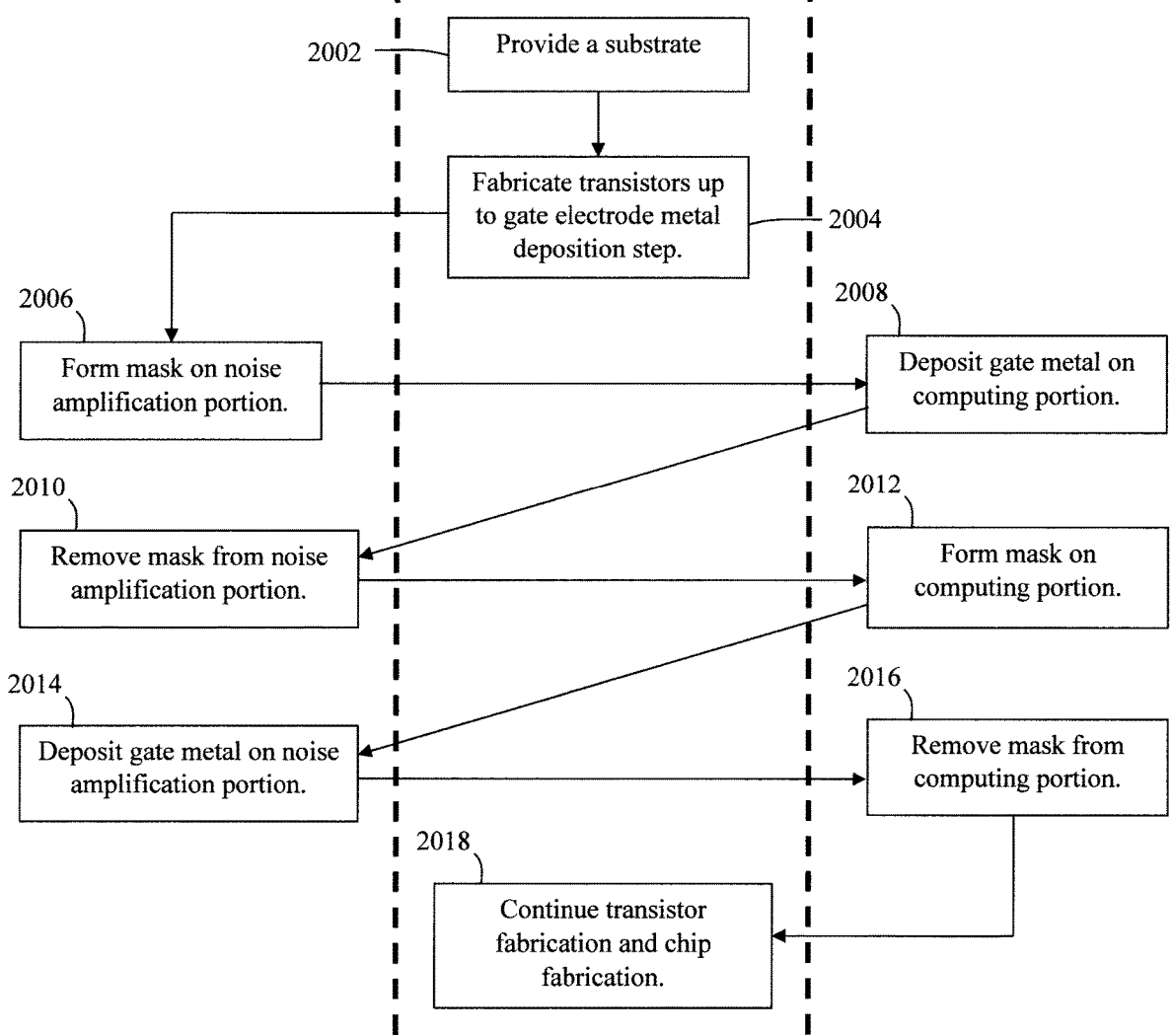
FIG. 20 is a diagram illustrating an exemplary methodology for co-fabricating the noise amplification unit monolithically with the computing unit by selective gate electrode workfunction modification according to an embodiment of the present invention.

In one exemplary embodiment, now described by way of reference to methodology 2000 of FIG. 20, the transistors in the noise amplification portion of the integrated circuit are fabricated using exactly the same structure and fabrication process as that of the transistors of the same channel type (i.e., n-type or p-type) in the computing portion of the integrated circuit, except that the gate electrode used in the noise amplification portion is formed of a metal having a different workfunction than that used in the computing portion, such that the transistors in the noise amplification unit have a $V_t$ of about zero.

Referring to methodology 2000, in step 2002 a (bulk semiconductor or SOI substrate) is provided, and in step 2004 the noise amplification unit and computing unit transistors are fabricated up to the gate electrode metal deposition step. Next, in step 2006 the standard process flow is modified by masking the noise amplification portion (e.g., with photoresist and/or a dielectric mask) prior to gate electrode metal deposition on the computing portion. With this mask in place over the noise amplification portion, in step 2008 a (first) gate electrode metal is deposited on the computing portion.

In step 2010, the mask is removed from the noise amplification portion and the process is then repeated to deposit the gate metal for the noise amplification portion. Namely, in step 2012 the computing portion is masked (e.g., with photoresist and/or a dielectric mask), and in step 2014 a (second) gate electrode metal (different from that used for the computing portion) is deposited on the noise amplification portion. In step 2016, the mask is removed from the computing portion, and in step 2018 the transistor and chip fabrication processes continue in a standard manner. As shown in FIG. 20, the process steps preceding step 2006 and following step 2016 is exactly the same for both (noise amplification/computing) transistor types, and therefore shared (i.e., performed simultaneously) on the two portions on the chip.

Figure 21:
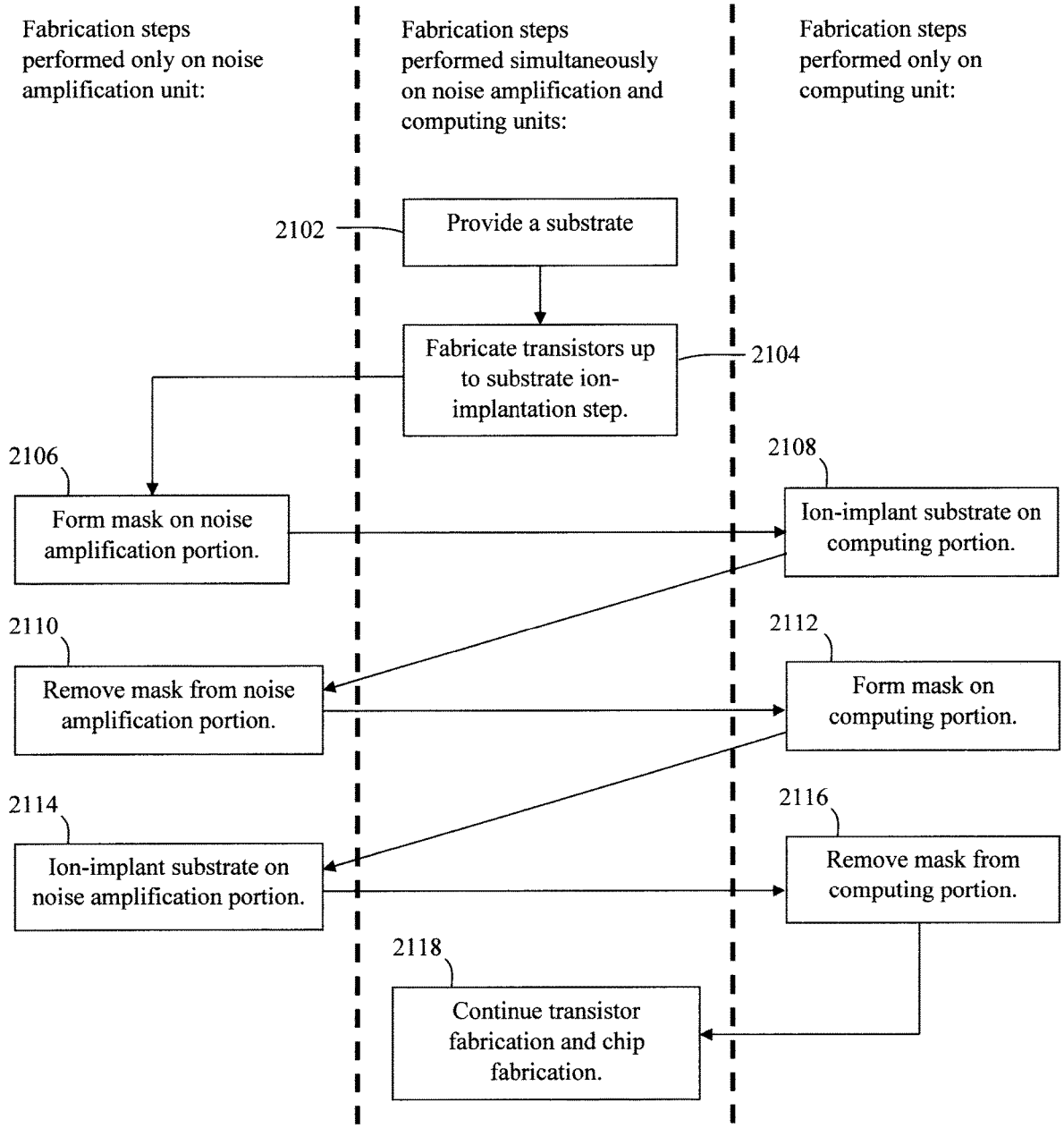
FIG. 21 is a diagram illustrating an exemplary methodology for co-fabricating the noise amplification unit monolithically with the computing unit by selective substrate doping modification according to an embodiment of the present invention.

In another exemplary embodiment, now described by way of reference to methodology 2100 of FIG. 21, the transistors in the noise amplification portion of the integrated circuit are fabricated using exactly the same structure and fabrication process as that of the transistors of the same channel type (n-type or p-type) in the computing portion of the integrated circuit, except that that the substrate in the noise amplification portion is doped to a lower concentration than that used in the computing portion, such that the transistors in the noise amplification unit have a $V_t$ of about zero.

Referring to methodology 2100, in step 2102 a (bulk semiconductor or SOI substrate) is provided, and in step 2104 the noise amplification unit and computing unit transistors are fabricated up to the substrate ion-implantation step, where the doping concentration of the transistor channel is defined by ion-implantation. Next, in step 2106 the standard process flow is modified by masking the noise amplification portion (e.g., with photoresist and/or a dielectric mask) prior to ion-implantation of the substrate on the computing portion. With this mask in place over the noise amplification portion, in step 2108 ion-implantation of the substrate on the computing portion is performed to define the channel doping concentration for the computing portion.

In step 2110, the mask is removed from the noise amplification portion and the process is then repeated to define the channel doping concentration for the noise amplification portion. Namely, in step 2112 the computing portion is masked (e.g., with photoresist and/or a dielectric mask), and in step 2114 ion-implantation of the substrate on the noise amplification portion is performed (with an ion dose and/or energy different from that used for computing portion). In step 2116, the mask is removed from the computing portion, and in step 2118 the transistor and chip fabrication processes continue in a standard manner. As shown in FIG. 21, the process steps preceding step 2106 and following step 2116 are exactly the same for both (noise amplification/computing) transistor types, and therefore shared (i.e., performed simultaneously) on the two portions on the chip.

Figure 22:
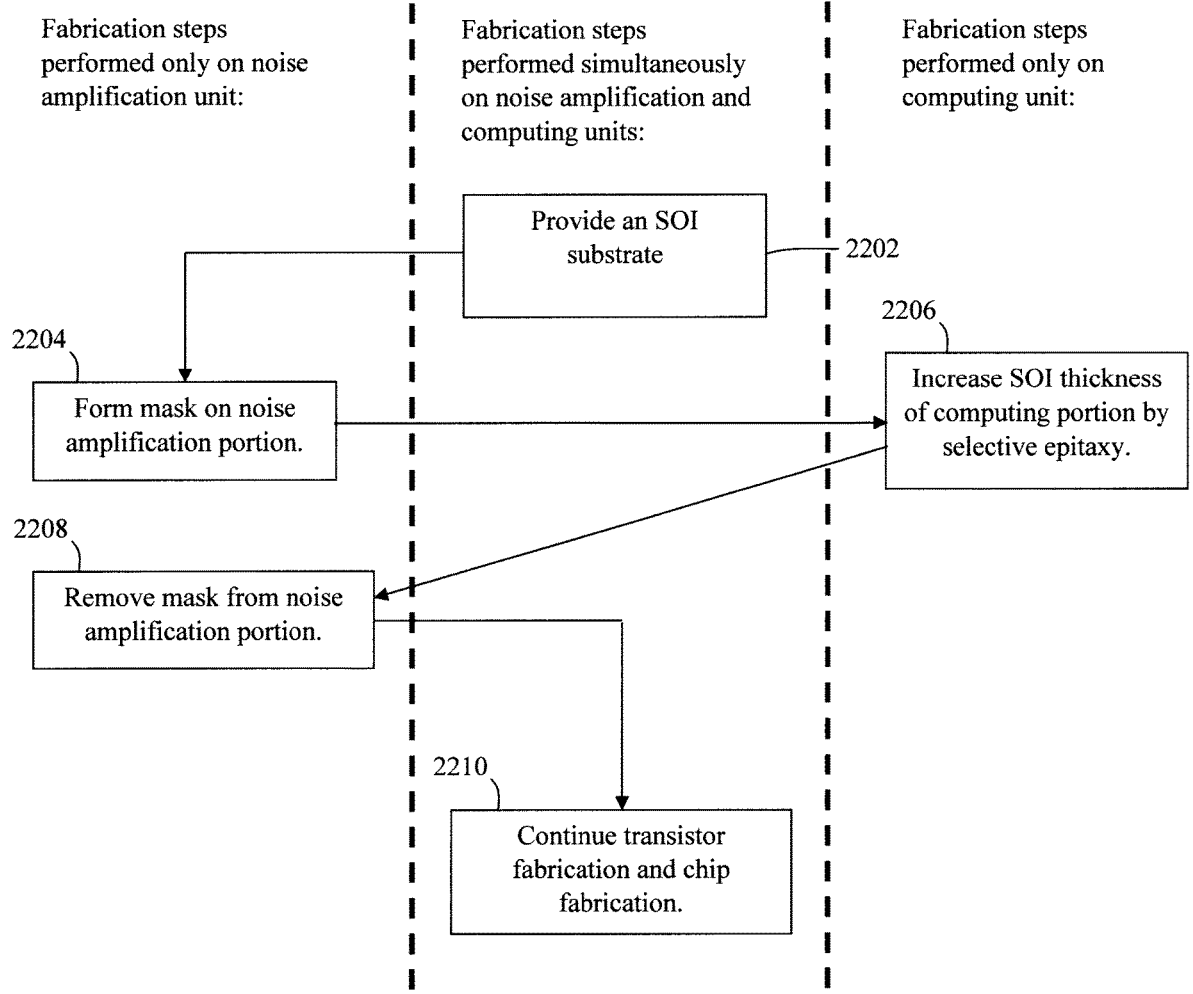
FIG. 22 is a diagram illustrating an exemplary methodology for co-fabricating the noise amplification unit monolithically with the computing unit by selective SOI substrate thickness modification using epitaxial growth to selectively increase the SOI substrate thickness according to an embodiment of the present invention.

In yet another exemplary embodiment, now described by way of reference to methodology 2200 of FIG. 22, the transistors in the noise amplification portion of the integrated circuit are fabricated using exactly the same structure and fabrication process as that of the transistors of the same channel type in the computing portion of the integrated circuit, except that that the SOI substrate thickness in the noise amplification portion is thinner that that used in the computing portion, such that the transistors in the noise amplification unit have a $V_t$ of about zero.

Referring to methodology 2200, in step 2202 a SOI substrate is provided. Next, in step 2204 the standard process flow is modified by masking the noise amplification portion (e.g., with a dielectric mask) and, in step 2206, using selective epitaxial growth to increase the thickness of the SOI in the computing portion. In step 2208, the mask is removed from the noise amplification portion, and in step 2210 the transistor and chip fabrication processes continue in a standard manner. As shown in FIG. 22, the process steps preceding step 2204 and following step 2208 are exactly the same for both (noise amplification/computing) transistor types, and therefore shared (i.e., performed simultaneously) on the two portions on the chip.

In still yet another exemplary embodiment, now described by way of reference to methodology 2300 of FIG. 23, instead of using selective epitaxial growth to increase the thickness of the SOI in the computing portion (as in methodology 2200 of FIG. 22 described above) the SOI thickness in the noise amplification unit portion is selectively reduced. For instance, referring to methodology 2300, in step 2302 a SOI substrate is provided. Next, in step 2304 the standard process flow is modified by masking the computing portion (e.g., with a dielectric mask) and, in step 2306, using a selective (e.g., wet) etching process us to reduce the SOI thickness in the noise amplification portion. In step 2308, the mask is removed from the computing portion, and in step 2310 the transistor and chip fabrication processes continue in a standard manner. As shown in FIG. 23, the process steps preceding step 2204 and following step 2208 are exactly the same for both (noise amplification/computing) transistor types, and therefore shared (i.e., performed simultaneously) on the two portions on the chip.

Other examples of modifications to the standard process flow for monolithic fabrication contemplated herein include, but are not limited to, using a different high-k material and/or a high-k material with a different thickness for the noise amplification unit (the masking steps will be the same as that described for the gate metal alteration in accordance with the description of methodology 2000 of FIG. 20, above), and using an opposite channel doping type for the noise amplification unit (the masking steps will be the same as that described for the alteration of channel doping concentration by ion-implantation in accordance with the description of methodology 2100 of FIG. 21, above). As will be appreciated by a person of ordinary skill in the art, changing more than one device parameter (e.g., both channel doping and metal workfunction) for adjusting the $V_t$ of the noise amplification portion is also viable, but it results in a greater number of additional process steps to accommodate the co-integration of the noise amplification portion in a monolithic process.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A random number generator, comprising:
a noise amplification unit configured to generate an amplified noise signal, wherein the noise amplification unit comprises noise amplification unit transistors having a threshold voltage ($V_{t,amp}$) of about 0; and
a computing unit configured to process the amplified noise signal from the noise amplification unit to generate a stream of random numbers, wherein the computing unit comprises computing unit transistors having absolute values of a $V_{t,compute}$ that are larger than the $V_{t,amp}$ of the noise amplification unit transistors in the noise amplification unit.

2. The random number generator of claim 1, wherein the noise amplification unit and the computing unit are integrated monolithically on a same integrated circuit chip.

3. The random number generator of claim 1, wherein the noise amplification unit and the computing unit are fabricated on separate integrated circuit chips that are bonded together.

4. The random number generator of claim 1, wherein all of the noise amplification unit transistors have a common channel type, and wherein the common channel type is n-channel or p-channel.

5. The random number generator of claim 1, wherein the $V_{t,amp}$ of the noise amplification unit transistors in the noise amplification unit is shifted to about zero volts by applying a voltage bias to the substrate.

6. The random number generator of claim 1, wherein the $V_{t,amp}$ of the noise amplification unit transistors is from about −0.3V to about 0.3V, and ranges therebetween.

7. The random number generator of claim 1, wherein the noise amplification unit transistors comprise:
at least one load transistor; and
at least one amplifying transistor.

8. The random number generator of claim 7, wherein the $V_{t,amp}$ of the at least one load transistor and the at least one amplifying transistor is about 0.

9. The random number generator of claim 7, wherein the noise amplification unit comprises an N-stage noise amplifier, and wherein at least one stage comprises:
a high-pass filter comprising a DC-blocking capacitor ($C_b$) and a bias resistor ($R_{bias}$).

10. The random number generator of claim 7, wherein the noise amplification unit comprises an N-stage noise amplifier, and wherein at least one stage comprises:
a high-pass filter comprising a DC-blocking capacitor ($C_b$) and a bias transistor $M_{bias}$.

11. The random number generator of claim 1, wherein amplification unit transistors are biased at zero gate-to-source voltage and operate in a subthreshold regime.

12. The random number generator of claim 1, the amplification unit transistors comprise at least one work-function setting metal configured to adjust the $V_{t,amp}$ of the amplification unit transistors to about 0.

13. The random number generator of claim 12, wherein the computing unit transistors and the noise amplification unit transistors both comprise n-channel transistors, and wherein a work-function of a metal gate electrode of the n-channel transistors in the noise amplification unit is lower than the work-function of the metal gate electrode of the n-channel transistors in the computing unit.

14. The random number generator of claim 12, wherein the computing unit transistors and the noise amplification unit transistors both comprise p-channel transistors, and wherein a work-function of a metal gate electrode of the p-channel transistors in the noise amplification unit is higher than the work-function of the metal gate electrode of the p-channel transistors in the computing unit.

15. The random number generator of claim 1, wherein the amplification unit transistors and the computing unit transistors have a common channel type, and wherein the amplification unit transistors have a channel doping concentration that is lower than the channel doping concentration of the computing unit transistors.

16. The random number generator of claim 1, wherein the amplification unit transistors and the computing unit transistors have a common channel type, and wherein the amplification unit transistors have a thinner channel than the computing unit transistors.

17. The random number generator of claim 1, wherein the amplification unit transistors and the computing unit transistors have a common channel type, and wherein the amplification unit transistors comprise channel dopants of opposite polarity to the channel dopants of the computing unit transistors.

18. A random number generator, comprising:
a noise amplification unit configured to generate an amplified noise signal, wherein the noise amplification unit comprises at least one load transistor and at least one amplifying transistor having a $V_{t,amp}$ of about 0; and
a computing unit comprising an analog-to-digital converter and a digital processor, wherein the analog-to-digital converter is configured to digitize the amplified noise signal, wherein the digital processor is configured to process the amplified noise signal that has been digitized by the analog-to-digital converter to generate a stream of random numbers, and wherein the computing unit comprises computing unit transistors having positive absolute values of a $V_{t,compute}$ that are larger than the $V_{t,amp}$ of the at least one load transistor and the at least one amplifying transistor.

19. The random number generator of claim 18, wherein the at least one load transistor and the at least one amplifying transistor each have a $V_{t,amp}$ of from about −0.3V to about 0.3V, and ranges therebetween.

20. A random number generator, comprising:
a noise amplification unit configured to generate an amplified noise signal, wherein the noise amplification unit comprises at least one load transistor and at least one amplifying transistor having a $V_{t,amp}$ of about 0; and
a computing unit comprising a sample and hold circuit and a comparator, wherein the sample and hold circuit is configured to sample the amplified noise signal, wherein the comparator is configured to compare the amplified noise signal sampled by the sample and hold circuit to a reference voltage ($V_{ref}$) to generate a stream of random numbers, and wherein the computing unit comprises computing unit transistors having positive absolute values of a $V_{t,compute}$ that are larger than the $V_{t,amp}$ of the at least one load transistor and the at least one amplifying transistor.

21. The random number generator of claim 20, wherein the at least one load transistor and the at least one amplifying transistor each have a $V_{t,amp}$ of from about −0.3V to about 0.3V, and ranges therebetween.

22. A method for random number generation, the method comprising the steps of:
generating an amplified noise signal using a noise amplification unit comprising noise amplification unit transistors having a $V_{t,amp}$ of about 0; and
processing the amplified noise signal from the noise amplification unit using a computing unit to generate a stream of random numbers, wherein the computing unit comprises computing unit transistors having positive absolute values of a $V_{t,compute}$ that are larger than the $V_{t,amp}$ of the noise amplification unit transistors.

23. The method of claim 22, wherein the $V_{t,amp}$ of the noise amplification unit transistors is from about −0.3V to about 0.3V, and ranges therebetween.

24. The method of claim 22, further comprising the steps of:
digitizing the amplified noise signal using an analog-to-digital converter; and
processing the amplified noise signal that has been digitized by the analog-to-digital converter to generate the stream of random numbers.

25. The method of claim 22, further comprising the steps of:
sampling the amplified noise signal using a sample and hold circuit; and
comparing the amplified noise signal sampled by the sample and hold circuit to a reference voltage ($V_{ref}$) to generate the stream of random numbers.

* * * * *